United States Patent
Igarashi et al.

(10) Patent No.: US 6,426,533 B2
(45) Date of Patent: Jul. 30, 2002

(54) SEMICONDUCTOR DEVICE AND MANUFACTURING METHOD THEREOF

(75) Inventors: Takayuki Igarashi; Yoshitaka Ohtsu, both of Hyogo (JP)

(73) Assignees: Mitsubishi Denki Kabushiki Kaisha, Tokyo; Ryoden Semiconductor System Engineering Corporation, Hyogo, both of (JP)

( * ) Notice: Subject to any disclaimer, the term of this patent is extended or adjusted under 35 U.S.C. 154(b) by 16 days.

(21) Appl. No.: 09/866,849

(22) Filed: May 30, 2001

Related U.S. Application Data

(62) Division of application No. 09/257,507, filed on Feb. 25, 1999, now Pat. No. 6,281,060.

(30) Foreign Application Priority Data

Sep. 3, 1998 (JP) .......................................... 10-249504

(51) Int. Cl.⁷ ........................ H01L 29/94; H01L 31/062; H01L 31/113
(52) U.S. Cl. ........................ 257/378; 257/273; 257/370
(58) Field of Search ................. 257/273, 370, 257/378

(56) References Cited

U.S. PATENT DOCUMENTS

| | | | |
|---|---|---|---|
| 5,057,894 A | * | 10/1991 | Ikeda et al. |
| 5,091,322 A | * | 2/1992 | Maeda et al. |
| 5,354,699 A | | 10/1994 | Ideka et al. |
| 5,414,291 A | | 5/1995 | Miwa et al. |
| 5,665,615 A | * | 9/1997 | Anmo |
| 5,665,616 A | * | 9/1997 | Kimura et al. |
| 5,998,843 A | * | 12/1999 | Yoshida |

FOREIGN PATENT DOCUMENTS

JP 63-281456 11/1988

* cited by examiner

Primary Examiner—Stephen D. Meier
(74) Attorney, Agent, or Firm—McDermott, Will & Emery

(57) ABSTRACT

A structure of a BiCMOS transistor hindering over-etching of source/drain regions of a MOS transistor and a manufacturing method thereof are provided. A polysilicon film that is to be a gate electrode lower layer of a MOS transistor is formed, and thereon, another polysilicon film that is to be a gate electrode upper layer of the MOS transistor as well as to be a base electrode of a bipolar transistor is formed. Thereafter, etching is conducted to form the polysilicon film to be the base electrode of the bipolar transistor and the gate electrode at the same time. Here, an oxide film shown in FIG. 4 serves as a protective film, thereby hindering over-etching of n type and p type wells to be active regions of respective MOS transistors.

4 Claims, 23 Drawing Sheets

SEMICONDUCTOR DEVICE AND MANUFACTURING METHOD THEREOF

This application is a divisional of application Ser. No. 09/257,507 filed Feb. 25, 1999 now U.S. Pat. No. 6,281,060.

BACKGROUND OF THE INVENTION

1. Field of the Invention

The present invention relates to a semiconductor device and a manufacturing method thereof, and more particularly to a semiconductor device including a BiCMOS (Bipolar Complementary Metal Oxide Semiconductor) circuit having an N channel MOS (Metal Oxide Semiconductor) field effect transistor, a P channel MOS field effect transistor and a bipolar transistor, and a method of manufacturing the same.

2. Description of the Background Art

Conventionally, a BiCMOS circuit has been used as a circuit of semiconductor device, which includes therein a bipolar transistor with large output allowing high-speed operation and a CMOS (Complementary Metal Oxide Semiconductor) transistor with low power dissipation performance allowing high-level integration.

Hereinafter, a structure of a conventional BiCMOS circuit and a manufacturing method thereof will be described with reference to FIGS. 34 to 43. In a conventional method of manufacturing a BiCMOS circuit, a p type underside isolating layer 105, an n type collector buried layer 102 of relatively high concentration, an n type buried layer 103, and a p type buried layer 104 are formed, spaced apart from one another by prescribed distances, substantially at the same depth from the surface of a p type semiconductor substrate 101.

Next, an n type epitaxial layer 106 of relatively low concentration is formed by epitaxial growth in a region from the surface of semiconductor substrate 101 to reach collector buried layer 102, that is to be an active region of a bipolar transistor. Adjacent to n type epitaxial layer 106, an n type collector wall region 108 of relatively high concentration is formed from the surface of semiconductor substrate 101 to collector buried layer 102. In an active region of a P channel MOS (p type Metal Oxide Semiconductor) transistor, an n type well 109 of relatively low concentration is formed from the surface of semiconductor substrate 101 reaching collector buried layer 103.

In an active region of an N channel MOS (n type Metal Oxide Semiconductor) transistor, a p type well 110 of relatively low concentration is formed from the surface of semiconductor substrate 101 to reach p type buried layer 104 of relatively high concentration. A p type isolating region 111 of low concentration is formed from the surface of semiconductor substrate 101 reaching a respective underside isolating layer 105.

Next, isolating oxide films 107e and 107g are formed on the respective surfaces of isolating regions 111 to separately form element forming regions. An isolating oxide film 107f for separating collector wall region 108 from n type epitaxial layer 106, an isolating oxide film 107h for separating n type well 109 from p type well 110, and an isolating oxide film 107i for separating p type well 110 from another region are also formed. Thereafter, on n type epitaxial layer 106, collector wall region 108, n type well 109, and p type well 110, which are to be active regions, oxide films 107b, 107a, 107c, and 107d are formed, respectively, which results in a structure as shown in FIG. 34.

Next, an n type polycrystalline silicon (polysilicon) film doped with phosphorus is deposited on the entire surface of the structure in FIG. 34, with a film thickness of 1500 Å. Thereafter, a tungsten silicide film with a film thickness of 2000 Å is formed on the polysilicon film. Next, the tungsten silicide film, the polysilicon film, oxide films 107a and 107b, and oxide films 107c and 107d are selectively etched to form, on the surface of n type well 109, a gate electrode 113 consisting of a polysilicon film 113a and a tungsten silicide film 113b and a gate oxide film 112, and to form, on the surface of p type well 110, a gate electrode 115 consisting of a polysilicon film 115a and a tungsten silicide film 115b and a gate oxide film 114. A structure shown in FIG. 35 is thus obtained.

Thereafter, as shown in FIG. 36, a mask 116 is formed to expose p type well 110. An n type impurity 200, e.g., high concentration phosphorus (hereinafter referred to as "P") ions, is then introduced at implant energy of 70 KeV with a dosage of $2\times10^{13}$ cm$^{-2}$, thereby forming n type source/drain regions 117a and 117b in p type well 110, as shown in FIG. 37. Thereafter, mask 116 is removed and an oxide film is deposited on the entire surface. Etching is then conducted to form sidewall oxide films 119a, 119b and sidewall oxide films 118a, 118b on respective sides of gate electrodes 113 and 115. Thereafter, as shown in FIG. 37, a mask 120 is formed to expose the surface of p type well 110, and an n type impurity 300, e.g., high concentration arsenic (hereinafter referred to as "As") ions, is introduced at implant energy of 50 KeV with a dosage of $4\times10^{15}$ cm$^{-2}$. Accordingly, n type source/drain regions 120a and 120b with an LDD (Lightly Doped Drain) structure are formed in p type well 110, as shown in FIG. 38.

Next, as shown in FIG. 38, masks 121a and 121b are formed to expose n type well 109. Thereafter, a p type impurity 400 of high concentration, e.g., boron fluoride (hereinafter referred to as "BF$_2$") ions, is introduced into n type well 109 at implant energy of 40 KeV with a dosage of $4\times10^{15}$ cm$^{-2}$, as shown in FIG. 38. Accordingly, p type source/drain regions 122a and 122b, as shown in FIG. 39, are formed.

Next, a 2000 Å thick polysilicon film is deposited on the entire surface, and BF$_2$ ions, for example, are introduced at implant energy of 40 KeV with a dosage of $4\times10^{15}$ cm$^{-2}$ to form a conductive polysilicon film that is to be a base electrode. In the step of implanting BF$_2$ ions, the BF$_2$ ions that have been transmitted through the polysilicon film are introduced into n type epitaxial layer 106, thereby forming a portion that is to be a p type external base region. Thereafter, a CVD oxide film with a film thickness of 3000 Å is further deposited to cover the entire surface. The CVD oxide film, the polysilicon film and the upper portion of n type epitaxial layer 106 are then dry etched using a mask, thus opening, as shown in FIG. 39, a region 106a in which an emitter electrode of the bipolar transistor is to be formed. CVD oxide films 123a and 124a, base electrodes 123b and 124b made of polysilicon film, and p type external base regions 126a and 126b are thus formed.

Thereafter, as shown in FIG. 40, a p type impurity 500 of high concentration, e.g., BF$_2$ ion, is introduced at implant energy of 30 KeV with a dosage of $6\times10^{13}$ cm$^{-2}$ from the emitter opening region into n type epitaxial layer 106, thereby forming a p type intrinsic base region 128, as shown in FIG. 41. Thereafter, a CVD oxide film is formed on the entire surface, and, by framing etching, sidewall oxide films 127a, 127b, 127c, and 127d are formed on respective sides of base electrodes 123b and 124b made of polysilicon film, and of CVD oxide films 123a and 124a. Next, a polysilicon film doped with no impurities is formed on the entire surface with a film thickness of 2000 Å, a high concentration n type impurity, e.g., As ions, is introduced at implant energy of 50 KeV with a dosage of $1\times10^{16}$ cm$^{-2}$ therein, and then the film is formed into a shape as shown in FIG. 42, which becomes an n type emitter electrode 129. Here, instead of implanting n type impurity ions, a polysilicon film doped with an n type impurity in advance may be formed.

Next, an interlayer oxide film 130 is formed on the entire surface of the structure shown in FIG. 42. In interlayer oxide film 130, contact holes 130a, 130b, 130c, 130d, 130e, 130f and 130g are formed to connect to collector wall region 108, emitter electrode 129, base electrode 124a, p type source/drain regions 122a and 122b, and n type source/drain regions 120a and 120b, respectively. Thereafter, aluminum is filled in contact holes 130a, 130b, 130c, 130d, 130e, 130f and 130g, and also formed on interlayer oxide film 130. Next, the aluminum is etched into a prescribed pattern to form aluminum interconnections 131, 132, 133, 134, 135, 136 and 137, whereby the BiCMOS circuit is completed.

According to the above-described manufacturing process of the BiCMOS circuit, however, the step of etching base electrodes 123b, 124b to form an opening reaching n type epitaxial layer 106, as shown in FIG. 39, causes p type source/drain regions 122a, 122b and n type source/drain regions 120a, 120b to be etched at the same time.

Furthermore, the step of etching the CVD oxide film to form sidewall oxide films 127a, 127b, 127c and 127d, as shown in FIG. 41, also causes p type source/drain regions 122a, 122b and n type source/drain regions 120a, 120b to be etched. As such, p type source/drain regions 122a, 122b and of n type source/drain regions 120a, 120b are subjected to etching twice, and thus surfaces thereof are scraped inevitably. This may lead to reduction in area of n type and p type wells 109 and 110 as impurity diffusion regions. As a result, there may be generated a leakage current due to unsatisfactory junction as well as variation in contact characteristics with respect to interconnections to be connected in a subsequent step.

Moreover, a large scale scraping of the surfaces of p type source/drain regions 122a, 122b and n type source/drain regions 120a, 120b due to such unnecessary etching may lead to increase in an aspect ratio of contact holes 130d, 130e, 130f and 130g for filling in the aluminum interconnections to be connected to the p type source/drain regions 122a, 122b and n type source/drain regions 120a, 120b in a subsequent step, as shown in FIG. 43. Accordingly, etching gases may not reach the bottom surfaces of contact holes 130d, 130e, 130f and 130g, i.e., p type source/drain regions 122a, 122b and n type source/drain regions 120a, 120b, thereby causing unsatisfactory etching.

SUMMARY OF THE INVENTION

An object of the present invention is to provide a semiconductor device including a BiCMOS circuit, which assures, in a step of forming a base electrode of a bipolar transistor in the BiCMOS circuit, semiconductor and contact characteristics of source/drain regions of a CMOS transistor and also allows improvement in gate resistance as well as contact characteristics of a gate electrode, and a manufacturing method thereof.

The method of manufacturing the semiconductor device according to an aspect of the present invention is specifically a method of manufacturing a semiconductor device provided with a bipolar transistor and a field effect transistor on a semiconductor substrate. The method includes the following steps.

Namely, the method of manufacturing a semiconductor device according to the present invention includes: the step of forming a first conductivity type collector region at least on the underside of a portion that is to be a first active region, the first active region being formed from the main surface of the semiconductor substrate to a prescribed depth; the step of forming an element isolating insulating film on the main surface of the semiconductor substrate to separately form, on the collector wall region, the first active region in which the bipolar transistor is to be formed, and, on a region except for that collector wall region, a second active region of a fist conductivity type in which the field effect transistor is to be formed; the step of forming first and second impurity layers of a first conductivity type in the first and second active regions, respectively; the step of forming a first insulating film on the main surface of the second active region; the step of forming a first conductive layer doped with a first conductivity type impurity on the first insulating film; the step of forming a first semiconductor layer on the main surface of the first active region and the first conductivity layer; the step of etching the first semiconductor layer, the first conductive layer, and the first insulating film to form a layer to be a base electrode on the first active region, as well as to form a gate electrode consisting of a gate electrode upper layer and a gate electrode lower layer and a gate insulating film on the second active region; the step of introducing a second conductivity type impurity into the layer to be the base electrode to form the base electrode, and introducing a second conductivity type impurity into the second active region to form a first impurity diffusion region; the step of covering with a second insulating film the gate electrode upper layer, gate electrode lower layer, gate insulating film, base electrode and first impurity diffusion region; the step of forming an opening in the second insulating film and base electrode; the step of introducing a second conductivity type impurity from the opening into the first active region to form a second impurity diffusion region to be a base region; the step of forming a sidewall insulating film on the sidewall of the opening; and the step of forming an emitter electrode in contact with the second impurity diffusion region to be fitted on the sidewall insulating film and the upper surface of the second insulating film.

According to these manufacturing steps, the base electrode and the gate electrode are formed simultaneously by etching the first semiconductor layer, the first conductive layer, and the first insulating film. Here, this etching step is conducted while the first insulating film protects the second active region. This means that the second active region that is to become the first impurity diffusion region is subjected to etching with the first insulating film as a protective film covered thereon, which can prevent excessive scraping. Similarly, the step of forming the opening in the base electrode is conducted with the presence of the second insulating film. This means that the second insulating film as a protective film protects the active region now being the first impurity diffusion region, and therefore, the surface of the first impurity diffusion region is prevented from being damaged. As a result, it becomes possible to provide a semiconductor device that can avoid degradation of semiconductor and contact characteristics due to the damage in the second active region or the first impurity diffusion region.

Preferably, in the method of manufacturing the semiconductor device according to the present invention, the step of forming the emitter electrode may include: the step of forming a second semiconductor layer having a layer to be the emitter electrode and a layer to be a resistance element, and the step of etching the second semiconductor layer to separately form the layer to be the emitter electrode and the layer to be the resistance element.

According to the above manufacturing steps, the second semiconductor layer constituting a resistance element can be formed at the same time as the formation of the layer to be an emitter electrode. As a result, it becomes possible to reduce the number of manufacturing steps in the method of manufacturing a semiconductor device including a bipolar transistor, a field effect transistor, and a resistance element on the same semiconductor substrate.

More preferably, the method of manufacturing the semiconductor device according to the present invention may further include the step of performing silicidation of the top portions of the collector region, base electrode, emitter electrode, gate electrode upper layer and the first impurity diffusion region, to form a metal silicide film.

According to the above manufacturing step, the metal silicide film is provided on the top portions of the emitter electrode, base electrode, gate electrode upper layer, and the first impurity diffusion region. Therefore, a semiconductor device allowing reduction in contact resistance when a contact interconnection is connected can be provided.

Impurity is distributed into the gate electrode upper layer by impurity diffusion from the lower layer of the gate electrode. Therefore, there is a possibility of insufficient diffusion of impurity in the gate electrode upper layer. In the absence of a metal silicide film, this may lead to increase in gate resistance in the vicinity of the upper surface of the gate electrode upper layer where the impurity is not diffused enough. According to the present manufacturing method, however, silicidation of the top of the gate electrode upper layer is achieved. The layer becomes thus conductive, whereby gate resistance of the gate electrode upper layer can be decreased. As a result, it is possible to provide a semiconductor device allowing improvement in semiconductor characteristics even when the gate electrode upper layer is formed using the step of diffusing impurity from the gate electrode lower layer to the gate electrode upper layer.

In the case the method of manufacturing the semiconductor device according to the present invention includes the step of forming a resistance element, the method includes the step of performing silicidation of the upper portions of the collector region, base electrode, emitter electrode, gate electrode upper layer and the first impurity diffusion region to form a metal silicide film, and also performing silicidation of a layer that is to become a resistance element planarly with a prescribed space to form a metal silicide film for a resistance element.

According to the above manufacturing method, it becomes possible to reduce contact resistance of a contact interconnection against the resistance element and to readily control a resistance value of the resistance element.

Furthermore, the method of manufacturing the semiconductor device according to the present invention may further include the step of forming a metal film on the base electrode and the gate electrode upper layer, instead of the above-described silicidation step.

According to the above manufacturing step, the base electrode and the gate electrode upper layer are provided with the metal film thereon. Therefore, it becomes possible to reduce possibility of generation of parasitic resistance. This parasitic resistance is generated due to the portion near the upper surface of the gate electrode upper layer where impurity is insufficiently diffused, which may cause increase in contact resistance, when a contact interconnection is connected to the gate electrode.

Preferably, the method of manufacturing the semiconductor device according to the present invention may further include the step of giving heat treatment to the gate electrode, after forming the base electrode and the gate electrode and before forming the first impurity diffusion region, to cause a first conductivity type impurity to diffuse from the gate electrode lower layer to the gate electrode upper layer.

According to the above manufacturing step, the impurity is diffused from the gate electrode lower layer to the gate electrode upper layer in the heat treatment step. As such, even when the gate electrode upper layer and the layer to be the base electrode are formed by etching and cutting out of the first semiconductor layer doped with no impurities, impurity can be diffused from the gate electrode lower layer to the gate electrode upper layer in this heat treatment step. Accordingly, it becomes possible to form a gate electrode with a prescribed impurity uniformly distributed therein, allowing reduction in the gate resistance. As a result, even when the base electrode and the gate electrode upper layer are formed in a same step by depositing the first semiconductor layer so as to reduce the number of manufacturing steps, a semiconductor device avoiding degradation in semiconductor characteristics can be provided.

The heat treatment step is conducted after etching of the first conductive layer and the first semiconductor layer is performed to isolate and form the base electrode and the gate electrode. Accordingly, the diffusion of impurity from the first conductive layer to the semiconductor layer is prevented, thereby allowing the impurity concentration of the base electrode of the bipolar transistor to be kept constant. As a result, a semiconductor device having a bipolar transistor with its semiconductor characteristics ensured can be provided.

Further, the step of heat treatment is a step normally conducted, and there is no need to add a new step of introducing an impurity into the gate electrode. Accordingly, the number of the steps as a whole is reduced.

More preferably, in the method of manufacturing the semiconductor device according to the present invention, impurity concentration of the impurity to be added to the first conductive layer to be the gate electrode lower layer is at least $1 \times 10^{20} \times \{(d_1+d_2)/d_2\}$ cm$^{-3}$, wherein $d_1$ designates the film thickness of gate electrode upper layer and $d_2$ designates the film thickness of the gate electrode lower layer.

According to the above manufacturing step, the impurity concentration of the gate electrode lower layer is at least $1 \times 10^{20} \times \{(d_1+d_2)/d_2\}$ cm$^{-3}$. This means that the amount of impurity that is introduced into the gate electrode lower layer includes the amount to be diffused into the gate electrode upper layer. Accordingly, the impurity concentration in the gate electrode as a whole is made uniform at an appropriate concentration after the impurity is diffused from the gate electrode lower layer to the gate electrode upper layer in a subsequent step of thermal diffusion. As a result, a semiconductor device allowing making small the gate resistance as well as contact resistance of the contact interconnection against the gate electrode can be provided.

More preferably, in the method of manufacturing the semiconductor device according to the present invention, the film thickness of the gate electrode lower layer is made equal to the film thickness of the gate electrode minus the film thickness of the base electrode.

According to the above manufacturing process, it becomes possible to deposit the base electrode and the first semiconductor layer to be a gate electrode upper layer in a same depositing step by adjusting in advance the film thickness of the gate electrode lower layer. Accordingly, the gate electrode and the base electrode can be formed in a single step, thereby permitting reduction in the number of manufacturing steps.

The semiconductor device according to the present invention is specifically a semiconductor device including a bipolar transistor and a field effect transistor on a semiconductor substrate. The gate electrode of the field effect transistor is formed of two layers, i.e., a gate electrode upper layer and a gate electrode lower layer, and the base electrode of the bipolar transistor and the gate electrode upper layer have the same film thickness.

To make such a structure, the above-described method of manufacturing the semiconductor device can be used. Accordingly, even when the gate electrode upper layer and the base electrode are formed from a same layer, the gate electrode and the base electrode can be formed with prescribed film thickness. As a result, the semiconductor device having this structure allows reduction in the number of manufacturing steps.

The semiconductor device according to the present invention has a feature that the gate electrode upper layer and the base electrode are both formed of a semiconductor layer doped with impurity, but having impurity concentrations different from each other.

According to the above structure, even when the base electrode and the gate electrode are formed at the same time using the above-described method of manufacturing the semiconductor device, it becomes possible to control semiconductor characteristics of the bipolar transistor and the field effect transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
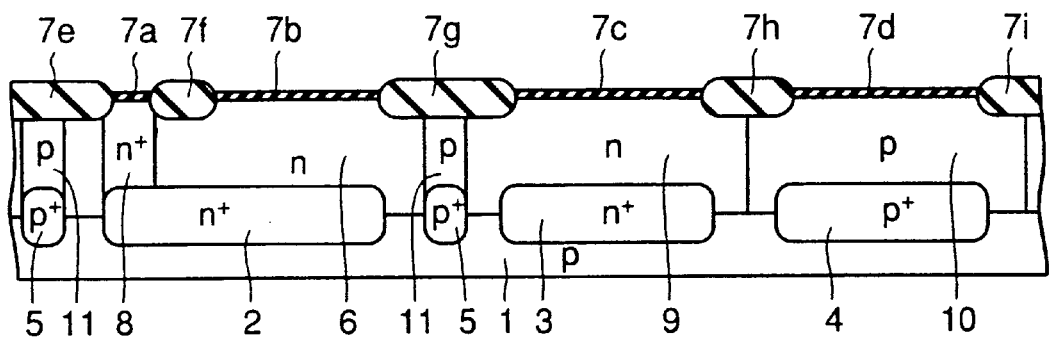
FIG. 1 is a cross section right after the formation of isolating oxide films for separating active regions of a bipolar transistor, a P channel MOS transistor and an N channel MOS transistor, in the manufacturing process of BiCMOS circuit according to a first embodiment of the present invention.

Hereinafter, embodiments of the present invention will be described with reference to the drawings.

First Embodiment

A structure of a BiCMOS circuit according to the first embodiment of the present invention and a manufacturing method thereof will be described with reference to FIGS. 1 to 15. In the method of manufacturing a BiCMOS circuit according to this embodiment, a p type underside isolating layer 5, an n type collector buried layer 2, an n type buried layer 3, and a p type buried layer 4, of relatively high concentration respectively, are first formed, spaced apart from one another with prescribed distances, substantially at the same depth from the surface of a p type semiconductor substrate 1.

Next, an n type epitaxial layer 6 of relatively low concentration is formed by epitaxial growth in an active region of a bipolar transistor, from the surface of semiconductor substrate 1 to reach collector buried layer 2. An n type collector wall region 8 of relatively high concentration is also formed, adjacent to n type epitaxial layer 6, from the surface of semiconductor substrate 1 reaching collector buried layer 2. In an active region of a P channel MOS transistor, an n type well 9 of relatively low concentration is formed from the surface of semiconductor substrate 1 down to n type buried layer 3. In an active region of an N channel MOS transistor, a p type well 10 of relatively low concentration is formed from the surface of semiconductor substrate 1 reaching p type buried layer 4. A p type isolating region 11 of relatively low concentration is formed from the surface of semiconductor substrate 1 reaching a respective underside isolating layer 5.

Next, isolating oxide films 7e and 7g for isolating and thus forming element forming regions are formed on the respective surfaces of isolating regions 11. An isolating oxide film 7f for separating collector wall region 8 from n type epitaxial layer 6, an isolating oxide film 7h for separating n type well 9 from p type well 10, and an isolating oxide film 7i for separating p type well 10 from another region are also formed, whereby active regions of respective transistors are formed, isolated from one another. Thereafter, oxide films 7a, 7b, 7c, and 7d are formed on the surface of semiconductor substrate 1, respectively on the surface of collector wall region 8 and on the surfaces of n type epitaxial layer 6, n type well 9, and p type well 10, which are to be active regions of bipolar transistor, P channel MOS transistor, and N channel MOS transistor, respectively. The structure as shown in FIG. 1 is thus achieved.

Next, a 1500 Å thick polycrystalline silicon (polysilicon) film doped with phosphorus in advance is deposited on the entire surface of the structure shown in FIG. 1. The polysilicon film is then etched to expose parts of respective isolating oxide films 7f and 7g, and oxide film 7b. Consequently, a polysilicon film 51a covering isolating oxide film 7e, oxide film 7a and isolating oxide film 7f, and a polysilicon film 51b covering isolating oxide film 7g, oxide film 7c, isolating oxide film 7h, oxide film 7d and isolating oxide film 7i are formed, as shown in FIG. 2.

Figure 2:
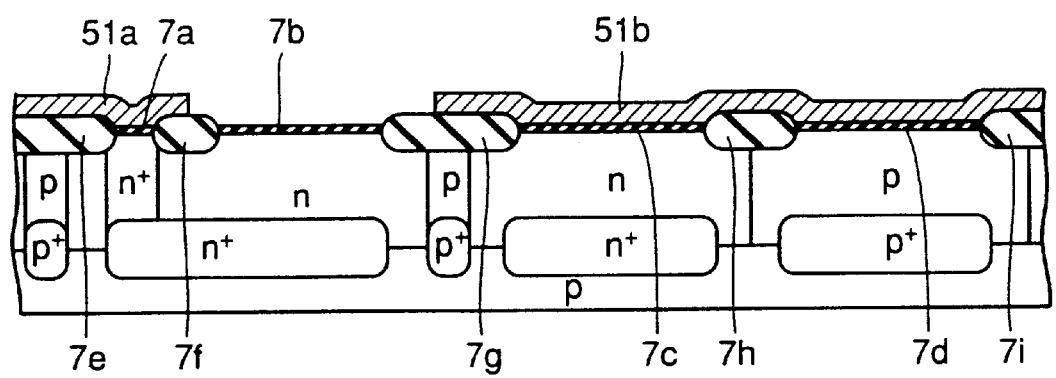
FIG. 2 is a cross section right after the formation of a polycrystalline silicon film doped with impurity in advance that is to become lower layers of gate electrodes of the P channel and N channel MOS transistors, in the manufacturing process of BiCMOS circuit according to the first embodiment of the present invention.
Figure 3:
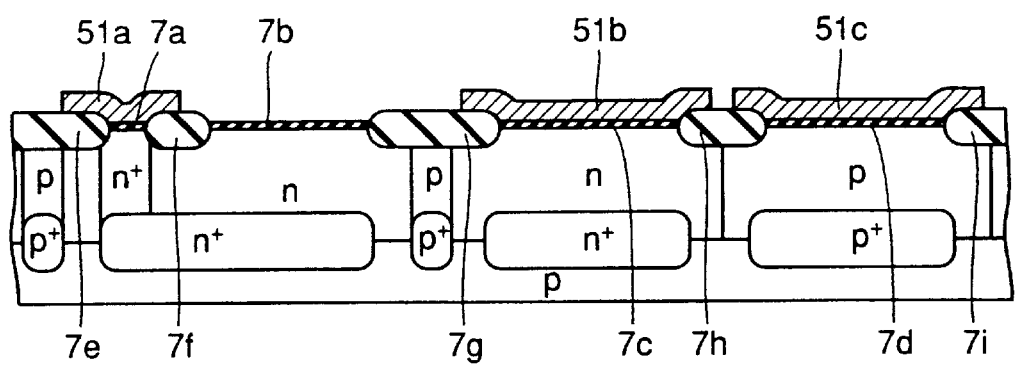
FIG. 3 is a cross section right after the formation of a polysilicon film to be lower layers of gate electrodes of the P and N channel MOS transistors and ion implantation of impurities with differing conductivity types, in the manufacturing process of the BiCMOS circuit according to the first embodiment of the present invention.

Here, the structure shown in FIG. 3, instead of that in FIG. 2, may be formed from the structure in FIG. 1. In this case, a polysilicon film doped with phosphorus in advance is deposited on the entire surface, and etched to expose oxide film 7b and parts of respective isolating oxide films 7f, 7g and 7h. Consequently, a polysilicon film 51a covering isolating oxide film 7e, oxide film 7a and isolating oxide film 7f, a polysilicon film 51b covering isolating oxide film 7g, oxide film 7c and isolating oxide film 7h, and a polysilicon film 51c covering isolating oxide film 7h, oxide film 7d and isolating oxide film 7i are formed.

Figure 4:
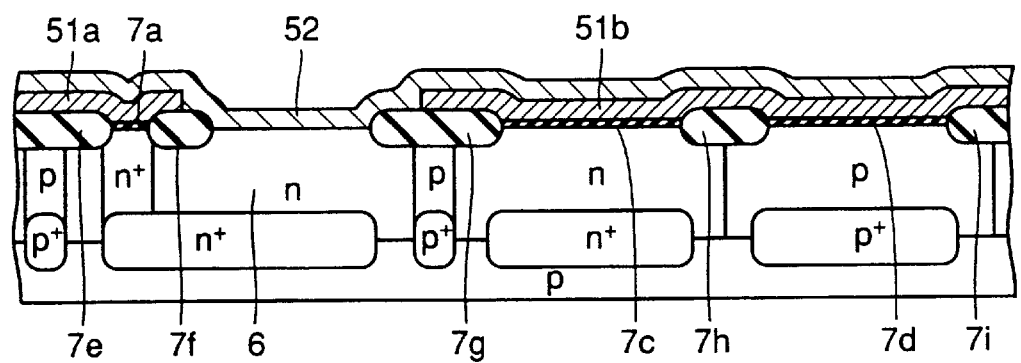
FIG. 4 is a cross section right after the formation of a polysilicon film to be a base electrode as well as a polysilicon film to be upper layers of gate electrodes of the P and N channel MOS transistors, in the manufacturing process of the BiCMOS circuit according to the first embodiment of the present invention.

Returning to FIG. 2, oxide film 7b is removed from the structure shown in FIG. 2, and, as shown in FIG. 4, a 1000 Å thick polysilicon film 52 doped with no impurities is deposited to cover polysilicon film 51a, isolating oxide film 7f, n type epitaxial layer 6, isolating oxide film 7g, and polysilicon film 51b.

Figure 5:
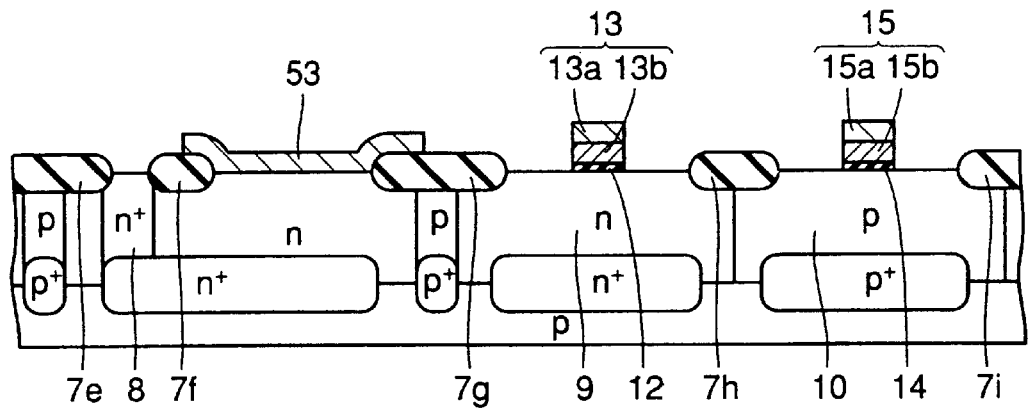
FIG. 5 is a cross section right after the formation of the polysilicon film to be a base electrode and the gate electrodes of the P and N channel MOS transistors, in the manufacturing process of the BiCMOS circuit according to the first embodiment of the present invention.
Figure 6:
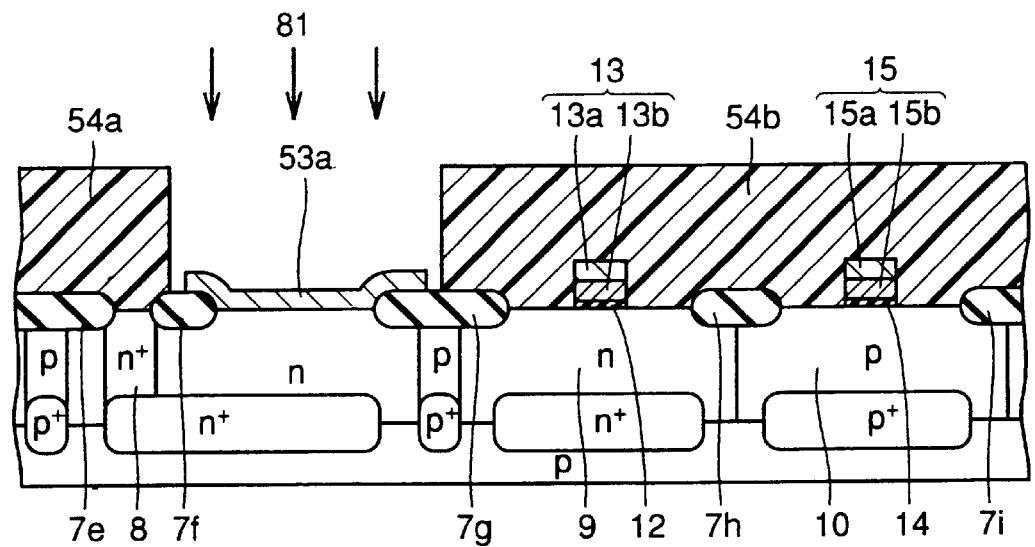
FIG. 6 is a cross section light after introduction of impurity into the polysilicon film to be a base electrode, in the manufacturing process of the BiCMOS circuit according to the first embodiment of the present invention.

Polysilicon film 52 is then selectively etched to form a polysilicon film 53 on n type epitaxial layer 6; a gate oxide film 12 and a gate electrode 13 consisting of polysilicon films 13a and 13b on the surface of n type well 9; and a gate oxide film 14 and a gate electrode 15 consisting of polysilicon films 15a and 15b on the surface of p type well 10, as shown in FIG. 5. Thereafter, masks 54a and 54b are formed to expose only parts of respective isolating oxide films 7f and 7g and polysilicon film 53, as shown in FIG. 6, and a p type impurity 81, e.g., $BF_2$ ions, is then introduced into polysilicon film 53 at implant energy of 40 KeV with a dosage of $4 \times 10^{15}$ cm$^{-2}$. A base electrode 53a is thus formed, and an impurity diffusion region to be an external base region is also formed in the vicinity of the surface of n type epitaxial layer 6.

Figure 7:
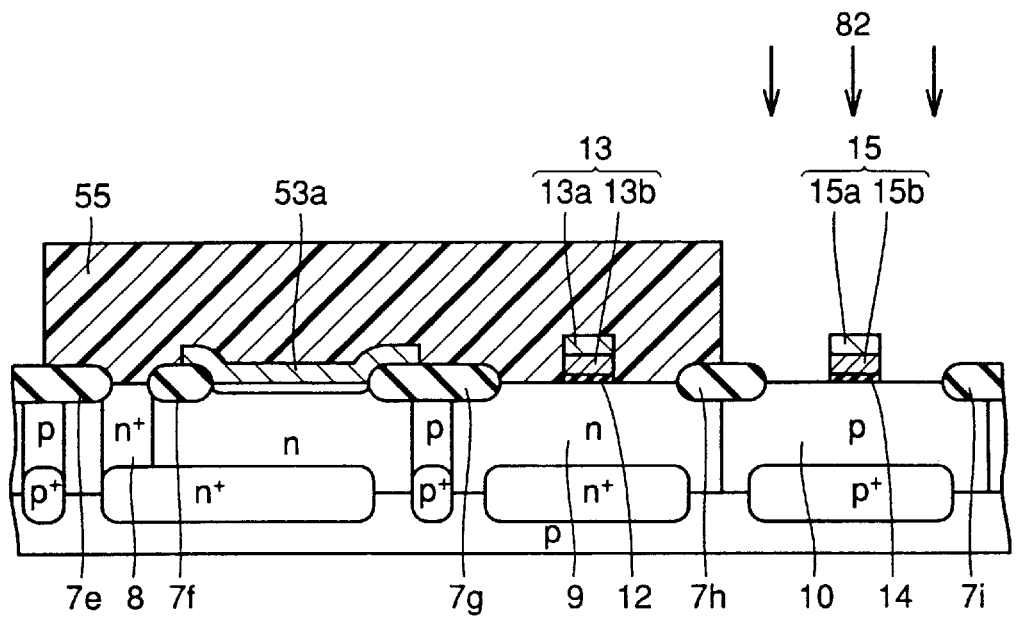
FIG. 7 is a cross section during introduction of impurity into a well of the N channel MOS transistor, in the manufacturing process of the BiCMOS circuit according to the first embodiment of the present invention.
Figure 8:
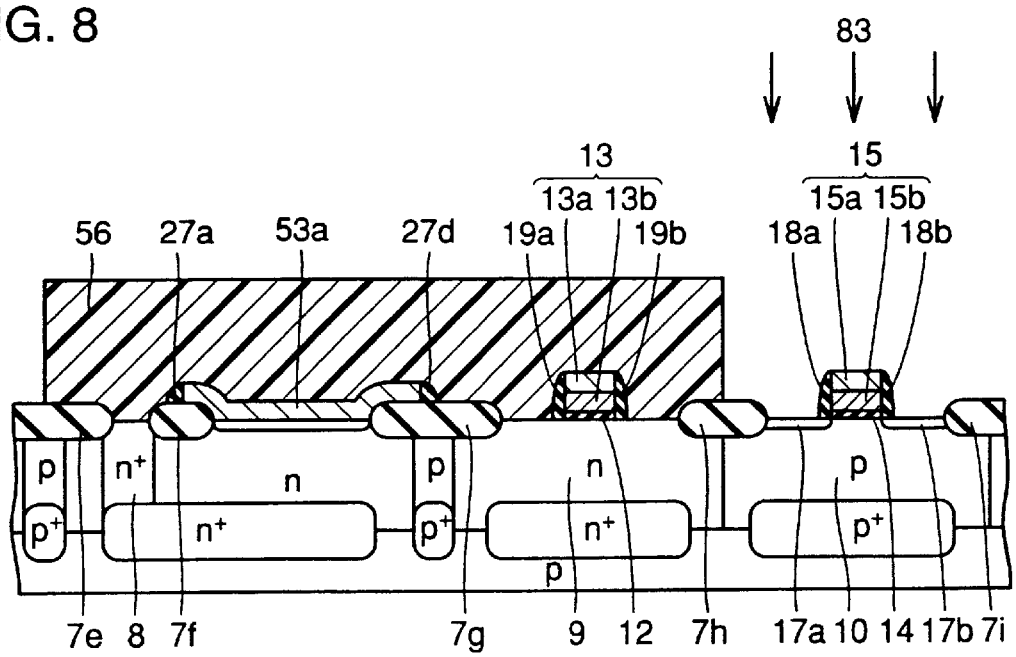
FIG. 8 is a cross section during introduction of impurity for the second time into the well of the N channel MOS transistor, in the manufacturing process of the BiCMOS circuit according to the first embodiment of the present invention.

Next, as shown in FIG. 7, a mask 55 is formed on a region except for the active region formed of p type well 10 and a part of isolating oxide film 7h. Thereafter, an n type impurity 82, e.g., P ions, is introduced at implant energy of 70 KeV with a dosage of $2 \times 10^{13}$ cm$^{-2}$ to form n type source/drain regions 17a and 17b in p type well 10, as shown in FIG. 8. Impurity 82 is also introduced into polysilicon film 15a that is to be an upper layer of gate electrode 15. Thereafter, mask 55 is removed, and an oxide film is deposited on the entire surface. Etching is then conducted to form sidewall oxide films 27a, 27d, 19a, 19b, 18a and 18b on respective sides of base electrode 53a, and gate electrodes 13 and 15.

Figure 9:
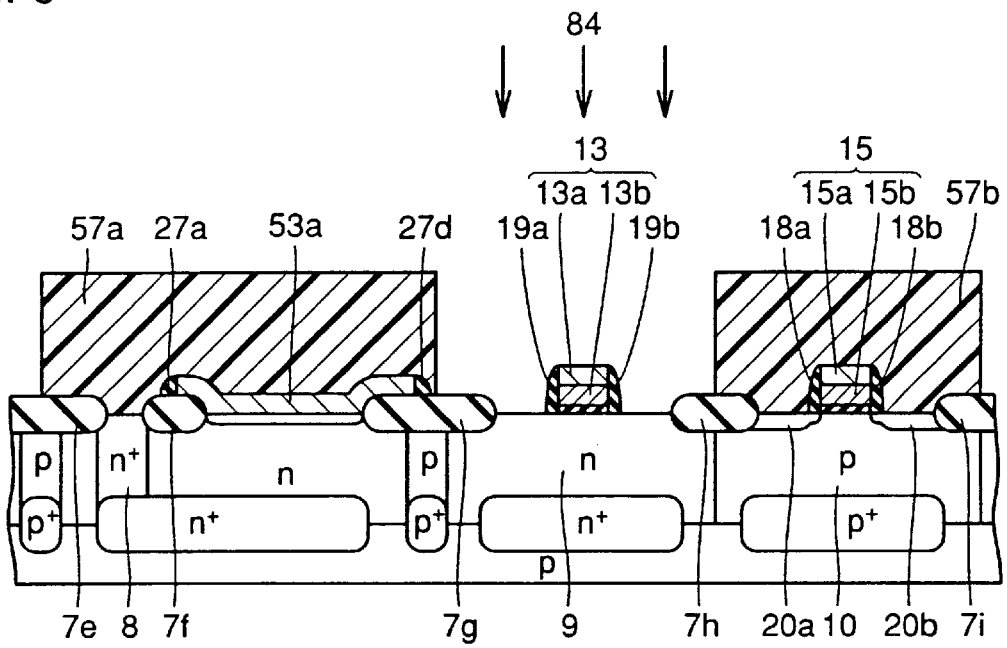
FIG. 9 is a cross section during introduction of impurity into a well of the P channel MOS transistor, in the manufacturing process of the BiCMOS circuit according to the first embodiment of the present invention.
Figure 10:
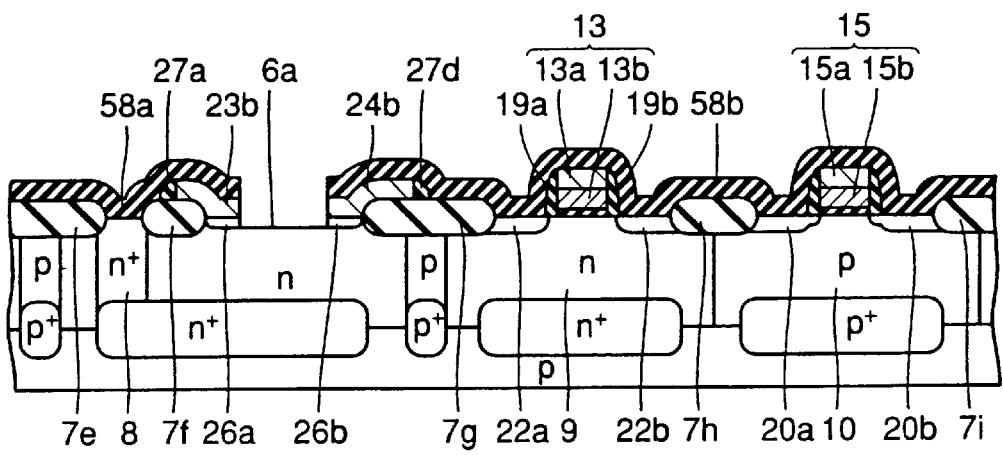
FIG. 10 is a cross section right after the formation of an opening by etching a polysilicon film that is to be a base electrode to expose an intrinsic base region, in the manufacturing process of the BiCMOS circuit according to the first embodiment of the present invention.

Thereafter, as shown in FIG. 8, a mask 56 is formed on a region except for the active region formed of p type well 10 and a part of isolating oxide film 7h. An n type impurity 83, e.g., As ions, is introduced at implant energy of 50 KeV with a dosage of $4 \times 10^{15}$ cm$^{-2}$. N type source/drain regions 20a and 20b as shown in FIG. 9 are thus formed in p type well 10, which has an LDD (Lightly Doped Drain) structure. Impurity 83 is also introduced into polysilicon film 15a that is to be the upper layer of gate electrode 15. Next, as shown in FIG. 9, masks 57a and 57b are formed to expose only parts of respective isolating oxide films 7g and 7h, and n type well 9. Thereafter, a p type impurity 84, e.g., $BF_2$ ions, is introduced at implant energy of 40 KeV with a dosage of $4 \times 10^{15}$ cm$^{-2}$ to form p type source/drain regions 22a and 22b as shown in FIG. 10. Impurity 84 is also introduced into polysilicon film 13a, which constitutes the upper layer of gate electrode 13.

Thereafter, a CVD oxide film with a film thickness of 3000 Å is deposited to cover the entire surface, and, as shown in FIG. 10, dry etching is conducted, using a mask, to open a region 6a in which an emitter electrode of the bipolar transistor is to be formed, and to form base electrodes 23b and 24b, and CVD oxide films 58a and 58b. External base regions 26a and 26b are formed by slightly etching region 6a for formation of the emitter electrode, in the vicinity of the surface of epitaxial layer 6. Thereafter, as shown in FIG. 11, a p type impurity 85, e.g., $BF_2$ ions, is introduced at implant energy of 30 KeV with a dosage of $6 \times 10^{13}$ cm$^{-2}$ from region 6a for formation of the emitter electrode, to form an intrinsic base region 28, as shown in FIG. 12.

Figure 11:
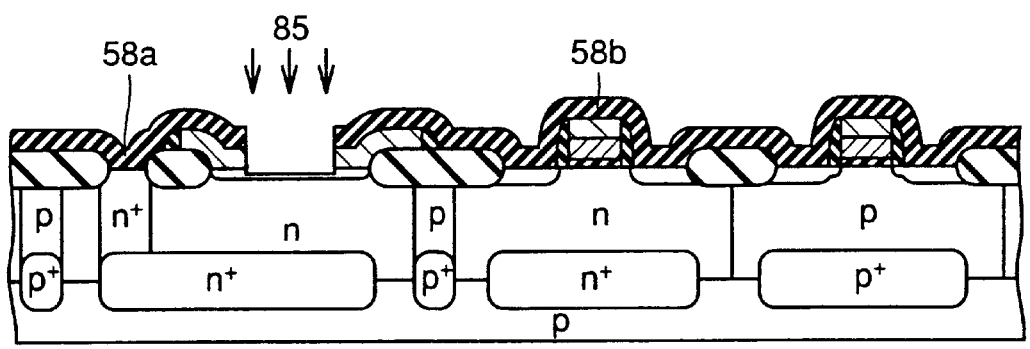
FIG. 11 is a cross section during introduction of impurity into the intrinsic base region, in the manufacturing process of the BiCMOS circuit according to the first embodiment of the present invention.
Figure 12:
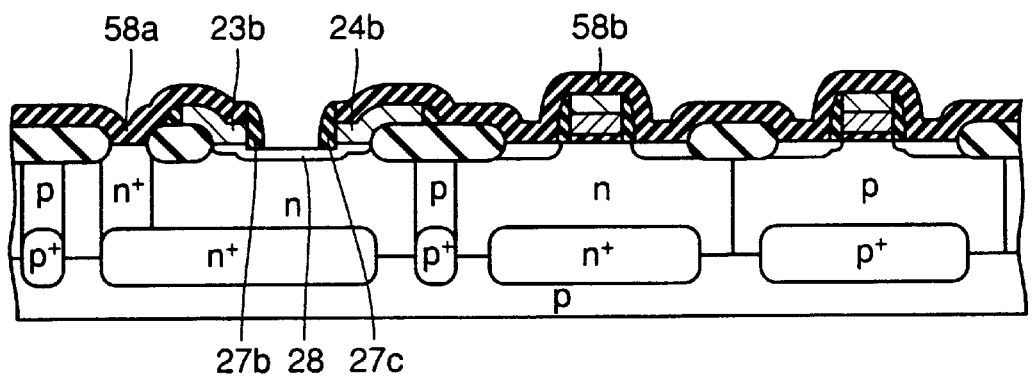
FIG. 12 is a cross section right after the formation of a sidewall oxide film on a side of the emitter electrode, in the manufacturing process of the BiCMOS circuit according to the first embodiment of the present invention.
Figure 13:
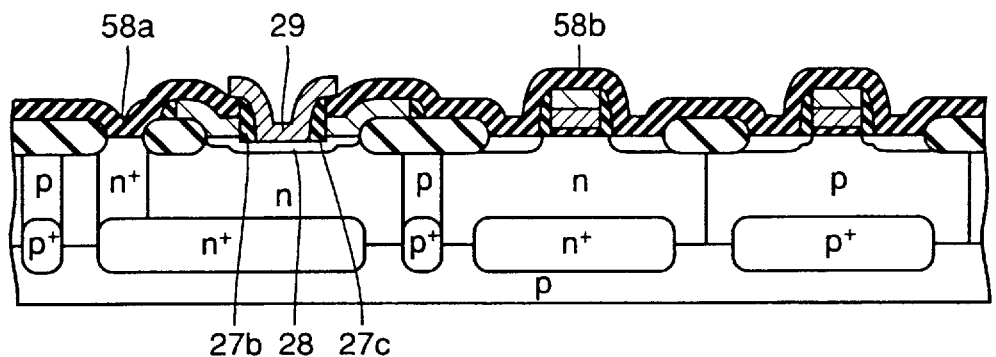
FIG. 13 is a cross section right after the formation of the emitter electrode connecting the intrinsic base region, in the manufacturing process of the BiCMOS circuit according to the first embodiment of the present invention.

Thereafter, a CVD oxide film is formed on the entire surface of the structure shown in FIG. 11. By framing etching, sidewall oxide films 27b and 27c are formed on respective sidewalls of base electrodes 23b and 24b, and of CVD oxide films 58a and 58b, as shown in FIG. 12. Next, a polysilicon film doped with no impurities is formed with a film thickness of 2000 Å on the entire surface of the structure shown in FIG. 12, and an n type impurity, e.g., As ions, is introduced at implant energy of 50 KeV with a dosage of $1 \times 10^{16}$ cm$^{-2}$. Etching is then conducted to obtain the shape as shown in FIG. 13, and an emitter electrode 29 is thus formed. It should be understood that, instead of ion implanting the n type impurity, a polysilicon film doped with an n type impurity in advance may be formed.

Figure 14:
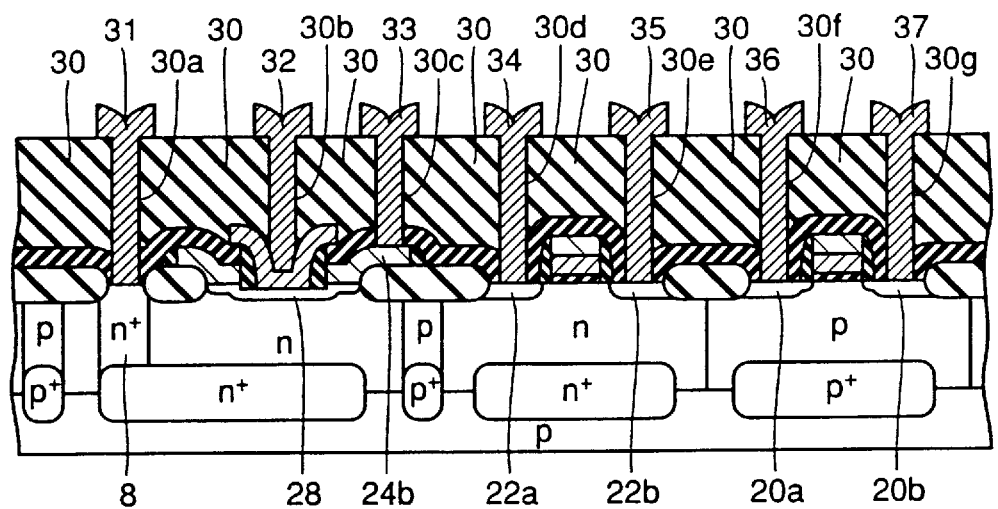
FIG. 14 is a cross section right after connecting aluminum interconnections to a collector wall region, emitter electrode, base electrode, and the source/drain regions of the P and N channel MOS transistors, in the manufacturing process of the BiCMOS circuit according to the first embodiment of the present invention.

Next, an interlayer oxide film 30 is formed on the entire surface. Contact holes 30a, 30b, 30c, 30d, 30e, 30f and 30g are then formed, respectively connecting to collector wall region 8, emitter electrode 29, base electrode 24b, p type source/drain regions 22a and 22b, and n type source/drain regions 20a and 20b. Aluminum is filled in contact holes 30a, 30b, 30c, 30d, 30e, 30f and 30g, and also formed on interlayer oxide film 30. The aluminum is then etched into a prescribed pattern to form aluminum interconnections 31, 32, 33, 34, 35, 36 and 37. The BiCMOS circuit according to the present embodiment is thus completed, of which a structure is shown in FIG. 14.

When the above-described manufacturing steps are taken to form gate electrodes 13 and 15 of the respective CMOS transistors and the polysilicon film that is to become base electrodes 23b and 24b of the bipolar transistor by dry etching at the same time, etch rate of oxide films 7c, 7d and 7a with respect to polysilicon films 51a, 51b and 52, shown in FIG. 4, is extremely slow. Accordingly, the surfaces of n type well 9 and p type well 10, which are active regions of the P channel and N channel MOS transistors, respectively, and the surface of collector wall region 8 are prevented from being etched through respective oxide films 7c, 7d and 7a. N type epitaxial layer 6, n type well 9 and p type well 10, which are active regions of the bipolar transistor, P channel MOS transistor and N channel MOS transistor, respectively, are thus free from damage due to etching, and therefore, stable transistor characteristics can be ensured for the bipolar transistors, P channel MOS transistor and N channel MOS transistor.

Gate electrodes 13 and 15 are normally formed of a polycrystalline or amorphous silicon film having a concentration on the order of $1\times10^{20}$ cm$^{-3}$. Accordingly, if the polysilicon film constituting the base electrodes 23b and 24b is made thick to reduce base resistance, polysilicon films 13a and 15a constituting the upper layers of respective gate electrodes 13 and 15 become also thick. Therefore, in order to distribute a sufficient amount of impurity in polysilicon films 13a and 15a constituting the respective gate electrode upper layers in a subsequent step of diffusing impurity by heat treatment, film thickness or impurity concentration of polysilicon films 13b and 15b constituting the lower layers of gate electrodes 13 and 15 needs to be increased.

At this time, excessive increase of the film thickness of polysilicon films 13b and 15b may lead to insufficient diffusion of the n type impurity from polysilicon films 13b and 15b constituting the lower layers of gate electrodes 13 and 15 to polysilicon films 13a and 15a constituting the upper layers of gate electrodes 13 and 15, depending on the temperature or time for heat treatment. This would cause reduction in impurity concentration of the surfaces of polysilicon films 13a and 15a constituting the upper layers of gate electrodes 13 and 15.

Furthermore, when introducing a p type impurity into n type well 9, the p type impurity is also introduced into gate electrode upper layer 13a constituting the upper layer of gate electrode 13, which is originally to be of n type, and thus a state like PN junction is formed in the vicinity of the upper surface of the gate electrode upper layer. This state analogous to PN junction causes increase in gate resistance of gate electrode 13, and also introduces contact failure between gate electrode 13 and the interconnection.

Figure 15:
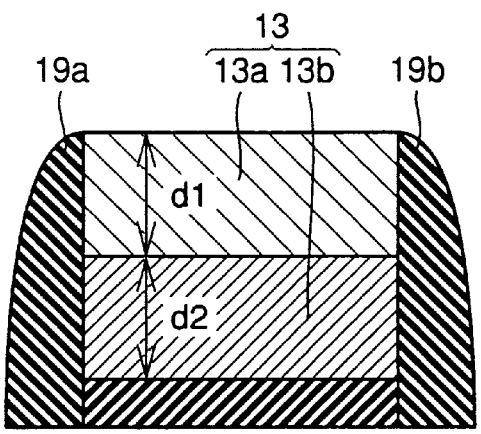
FIG. 15 is a cross section showing the film thickness of gate electrode upper and lower layers, in the manufacturing process of the BiCMOS circuit according to the first embodiment of the present invention.

Accordingly, when forming gate electrodes 13 and 15 of the respective P channel and N channel MOS transistors, as shown in FIG. 15, the impurity concentration of polysilicon films 13b and 15b is made at least $1\times10^{20}\times\{(d_1+d_2)/d_2\}$ cm$^{-3}$. Here, $d_1$ and $d^2$ designate, respectively, the film thickness of polysilicon films 13a and 15a to be upper layers of gate electrodes 13 and 15, and of polysilicon films 13b and 15b to be lower layers of gate electrodes 13 and 15.

By realizing the structure having such concentration, thermal diffusion of the impurity from polysilicon films 13b and 15b to polysilicon films 13a and 15a, respectively, in a subsequent step leads to a uniform diffusion of impurity in polysilicon films 13a and 15a with impurity concentration of $1\times10^{20}$ cm$^{-3}$, thus avoiding reduction in impurity concentration of the surfaces of polysilicon films 13a and 15a. As a result, it becomes possible to suppress increase in gate resistance of gate electrodes 13 and 15, as well as increase in contact resistance between gate electrodes 13, 15 and aluminum interconnections 31, 32, 33, 34, 35, 36 and 37.

Second Embodiment

Figure 16:
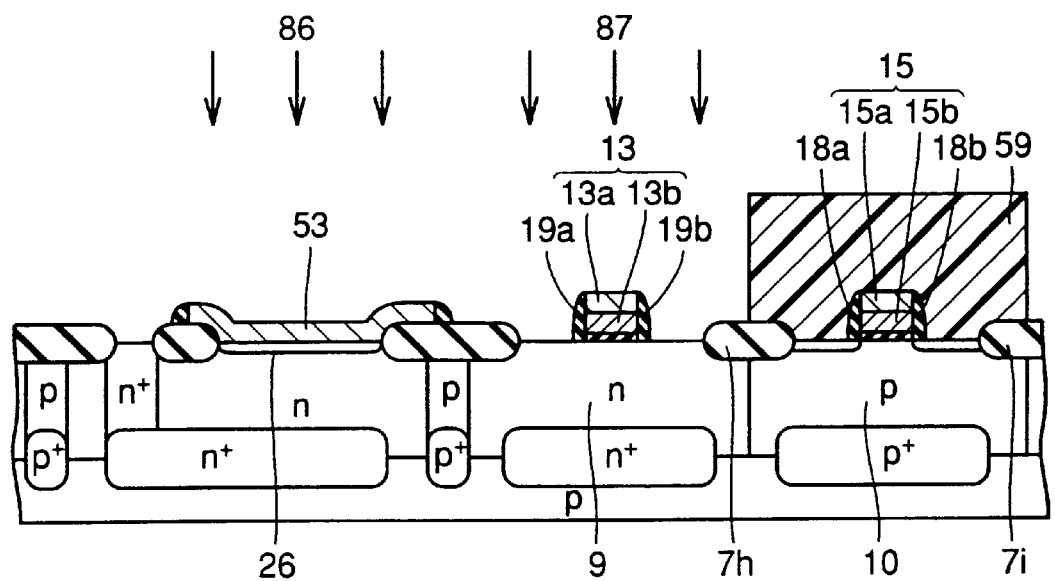
FIG. 16 is a cross section right after introducing impurity into the base electrode and to the well of P channel MOS transistor, in the manufacturing process of the BiCMOS circuit according to a second embodiment of the present invention.

A structure of BiCMOS circuit according to the second embodiment of the present invention and a method of manufacturing the same will be described with reference to FIG. 16. The manufacturing method of the BiCMOS circuit according to the present embodiment is similar to that of the first embodiment up to the step of forming mask 55 and introducing impurity 82 into p type well 10 as shown in FIG. 7, to form source/drain regions 17a and 17b shown in FIG. 8, except that, in the present embodiment, ion implantation into the polysilicon film 53 is not conducted at the state shown in FIG. 5.

Subsequently, an impurity 83 is introduced, as shown in FIG. 8. A mask 59 is then formed at p type well 10 that is to be an active region of the N channel MOS transistor, as shown in FIG. 16, and p type impurities 86 and 87 both of high concentration are simultaneously introduced into polysilicon film 53 that is to be a base electrode of the bipolar transistor and into n type well 9, respectively. Accordingly, base electrode 53a and source/drain regions 22a and 22b of the P channel MOS transistor are formed in a single step. The subsequent manufacturing steps are the same as those in the first embodiment, as shown in FIG. 9 and the following drawings.

By taking the above-described steps, the number of manufacturing steps can be reduced by one step compared to the first embodiment, which leads to reduction in manufacturing cost.

Third Embodiment

A structure of BiCMOS circuit according to the third embodiment of the present invention and a method of manufacturing the same will be described with reference to FIGS. 17 to 21. The method of manufacturing the BiCMOS circuit according to the present embodiment takes steps similar to those in the first embodiment up to forming mask 55 as shown in FIG. 7 and introducing impurity 82 into p type well 10 to form n type source/drain regions 17a and 17b as shown in FIG. 8. Thereafter, different from the first and second embodiments, the present embodiment takes the step of introducing p type impurities 89 and 92 in two times to form source/drain regions 22a and 22b, as shown in FIGS. 18 and 20, while introducing impurity into polysilicon film 53 at the same time. Ion implantation into polysilicon film 53 is not performed in the state shown in FIG. 5.

Figure 17:
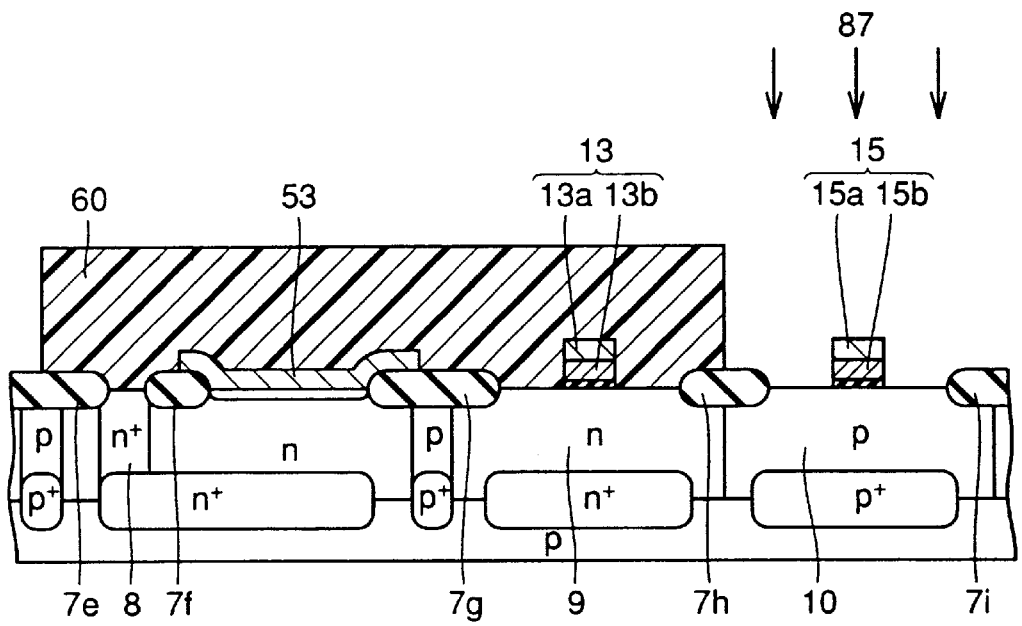
FIG. 17 is a cross section during introduction of impurity into a well of N channel MOS transistor, in the manufacturing process of the BiCMOS circuit according to a third embodiment of the present invention.
Figure 18:
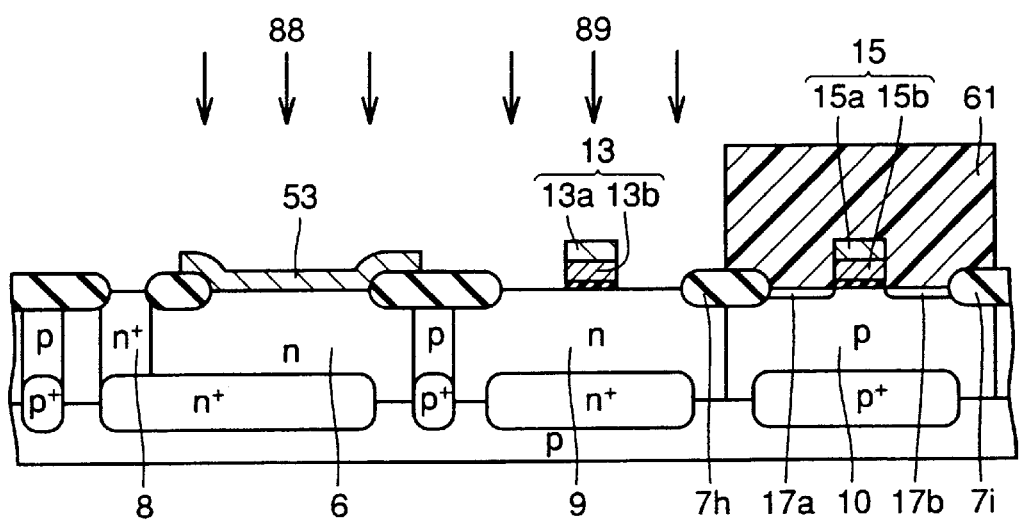
FIG. 18 is a cross section right after introducing impurity into the well of P channel MOS transistor and a polysilicon film to be a base electrode, in the manufacturing process of the BiCMOS circuit according to the third embodiment of the present invention.

Namely, according to the present embodiment, the step shown in FIG. 7 is performed without conducting ion implantation into polysilicon film 53 at the state as shown in FIG. 5, and a mask 60 is formed to expose p type well 10, as shown in FIG. 17. Thereafter, using mask 60, a low concentration n type impurity 87, e.g., P ions, is introduced into p type well 10 that is to be an N channel MOS transistor, at implant energy of 70 KeV with a dosage of $2\times10^{13}$ cm$^{-2}$.

Next, as shown in FIG. 18, p type well 10 and isolating oxide films 7h and 7i are covered with a mask 61. Introduction of a low concentration p type impurity 88, e.g., B ions, into polysilicon film 53 to be a base electrode of the bipolar transistor at implant energy of 10 KeV with a dosage of 1×10$^{13}$ cm$^{-2}$, and introduction of a p type impurity 89 into n type well 9 to be an active region of the P channel MOS transistor are then conducted simultaneously, whereby base electrode 53a and p type source/drain regions 22a and 22b are formed, as shown in FIG. 19.

At this time, the p type impurity is also introduced into collector wall region 8 of n type. However, the n type impurity concentration of collector wall region 8 is relatively large compared to the impurity concentration of p type impurity 88, and therefore, the conductivity of collector wall region 8 is not affected considerably. In the case there is a problem in conductivity of collector wall region 8 due to its low concentration, a mask 61 may be formed on collector wall region 8. A CVD oxide film is then formed on the entire surface, and by framing etching, sidewall oxide films 27a and 27d on respective sides of base electrode 53a, sidewall oxide films 19a and 19b on respective sides of gate electrode 13, and sidewall oxide films 18a and 18b on respective sides of gate electrode 15 are formed.

Figure 19:
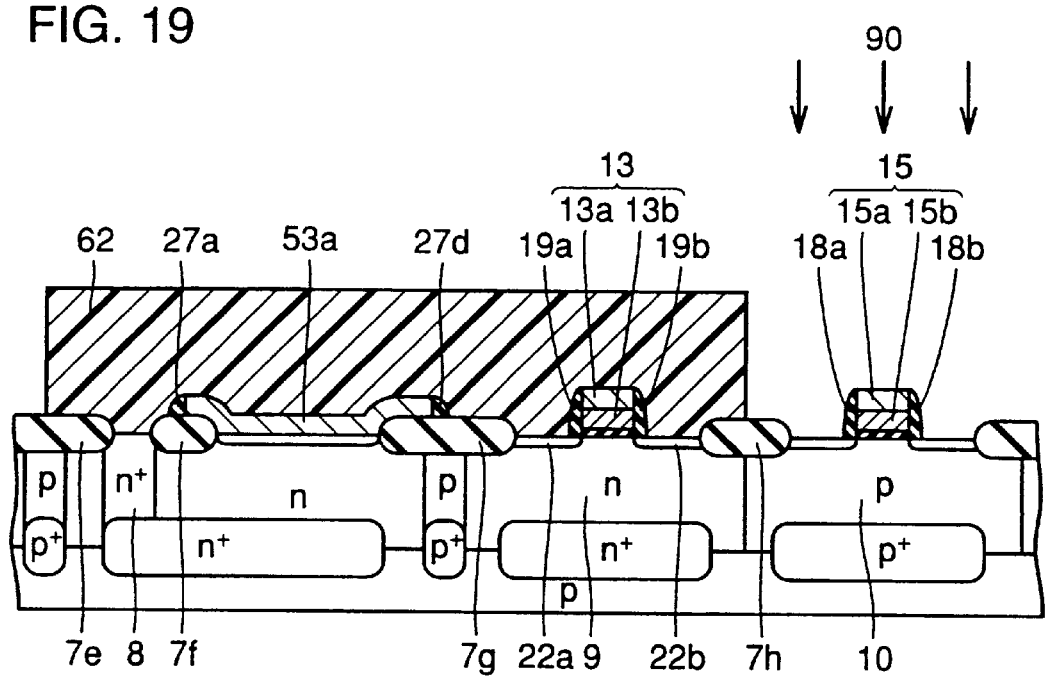
FIG. 19 is a cross section during introduction of impurity for the second time into the well of the N channel MOS transistor, in the manufacturing process of the BiCMOS circuit according to the third embodiment of the present invention.
Figure 20:
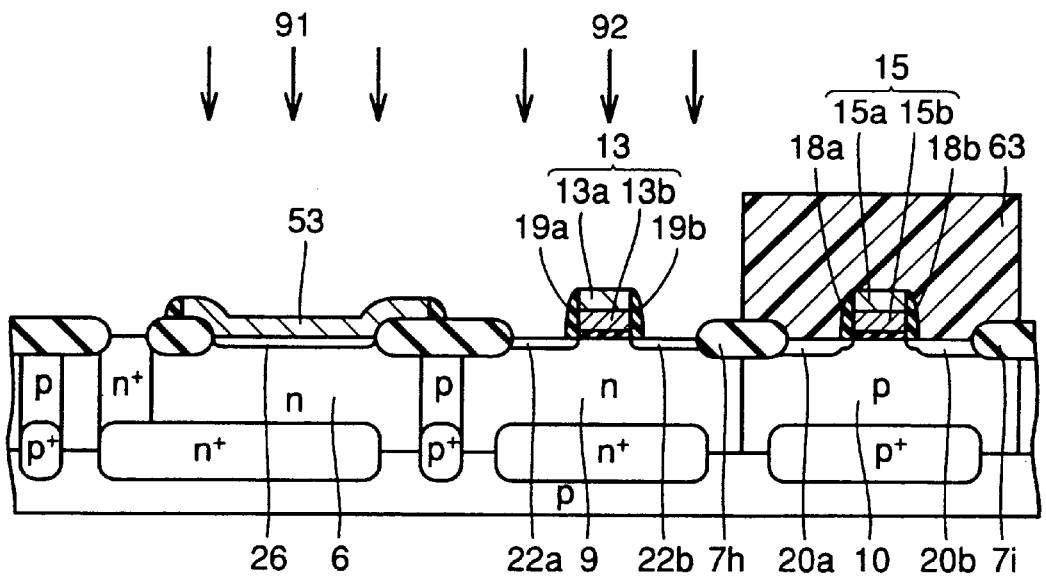
FIG. 20 is a cross section during introduction of impurity into the polysilicon film to be a base electrode and to source/drain regions of the P channel MOS transistor, in the manufacturing process of the BiCMOS circuit according to the third embodiment of the present invention.
Figure 21:
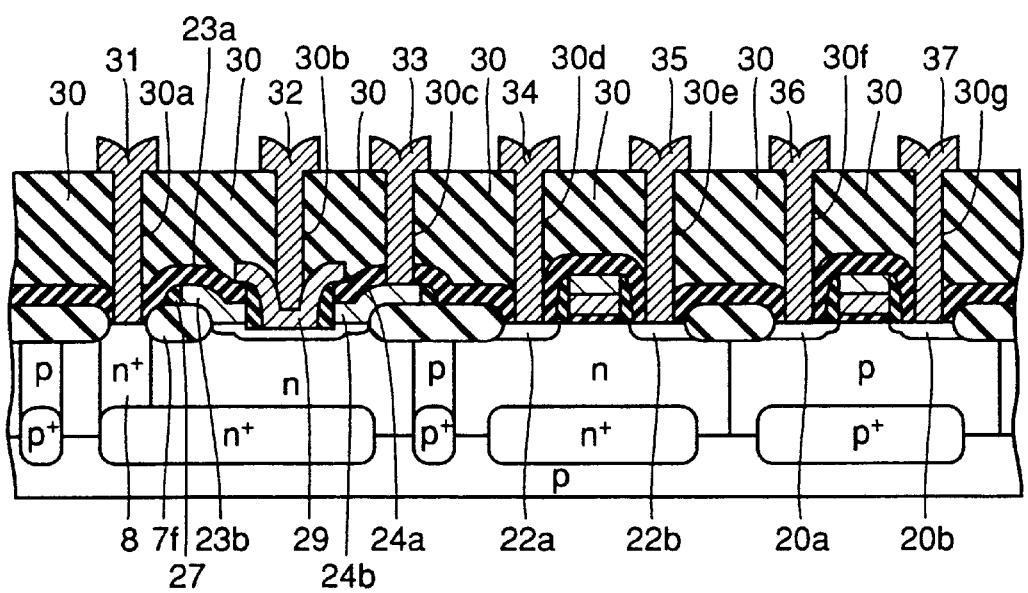
FIG. 21 is a cross section right after connecting aluminum interconnections to a collector wall region, emitter electrode, base electrode, source/drain regions of the P and N channel MOS transistors, in the manufacturing process of the BiCMOS circuit according to the third embodiment of the present invention.

Next, as shown in FIG. 19, a mask 62 is formed to expose p type well 10. Thereafter, a high concentration, n type impurity 90 is introduced into p type well 10 to be an active region of the N channel MOS transistor. Next, as shown in FIG. 20, a mask 63 is formed to cover p type well 10 to become the active region of the N channel MOS transistor as well as isolating oxide films 7h and 7g. A high concentration, p type impurity 91 is then introduced into polysilicon film 53 that is to be a base electrode of the bipolar transistor, whereby the base electrode is formed. At the same time, a high concentration, p type impurity 92 is introduced into n type well 9 that is to be an active region of the P channel MOS transistor, whereby p type source/drain regions 22a and 22b are formed, as shown in FIG. 21.

Next, an interlayer oxide film 30 is formed on the entire surface, and then contact holes 30a, 30b, 30c, 30d, 30e, 30f and 30g are formed, which respectively connect to collector wall region 8, emitter electrode 29, base electrode 24b, p type source/drain regions 22a and 22b, and n type source/drain regions 20a and 20b. Thereafter, aluminum is filled in contact holes 30a, 30b, 30c, 30d, 30e, 30f and 30g, and also formed on interlayer oxide film 30. Next, the aluminum is etched into a prescribed pattern to form aluminum interconnections 31, 32, 33, 34, 35, 36 and 37. Accordingly, the BiCMOS circuit according to the present embodiment is completed, the structure of which is shown in FIG. 21.

As described above, impurities are introduced into polysilicon film 53 to be a base electrode of the bipolar transistor and n type well 9 to be an active region of the P channel MOS transistor at the same time as shown in FIGS. 18 and 20. Accordingly, the P channel MOS transistor structure having the LDD structure can be formed without increasing the number of steps.

Fourth Embodiment

Figure 22:
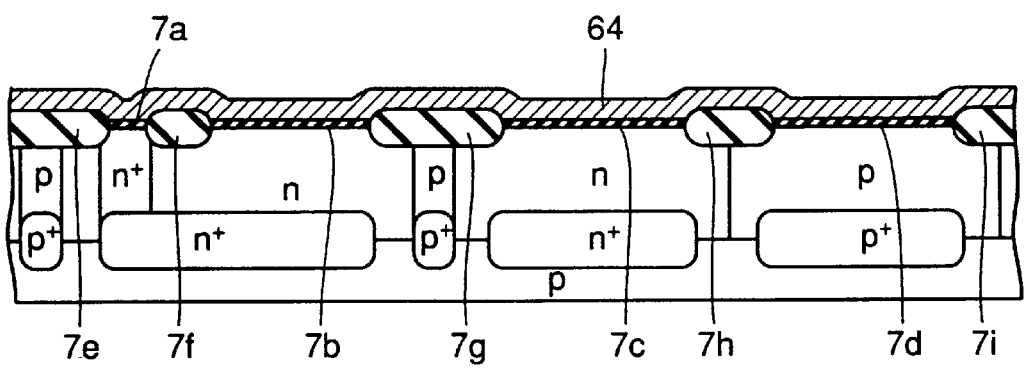
FIG. 22 is a cross section right after depositing a polysilicon film doped with impurity to be a gate electrode lower layer, in the manufacturing process of the BiCMOS circuit according to a fourth embodiment of the present invention.

A structure of BiCMOS circuit according to the fourth embodiment and a manufacturing method thereof will be described with reference to FIGS. 22 to 24. The method of manufacturing the BiCMOS circuit according to the present embodiment takes the same steps as in the first embodiment up to form the structure as shown in FIG. 1. Next, as shown in FIG. 22, a polysilicon film 64 that is doped with no n type impurities is deposited on the entire surface of the structure shown in FIG. 1, with a film thickness of 1500 Å. Thereafter, an impurity, e.g., P ions, is introduced on the entire surface of polysilicon film 64, at implant energy of 20 KeV with a dosage of 7×10$^{15}$ cm$^{-2}$.

Figure 23:
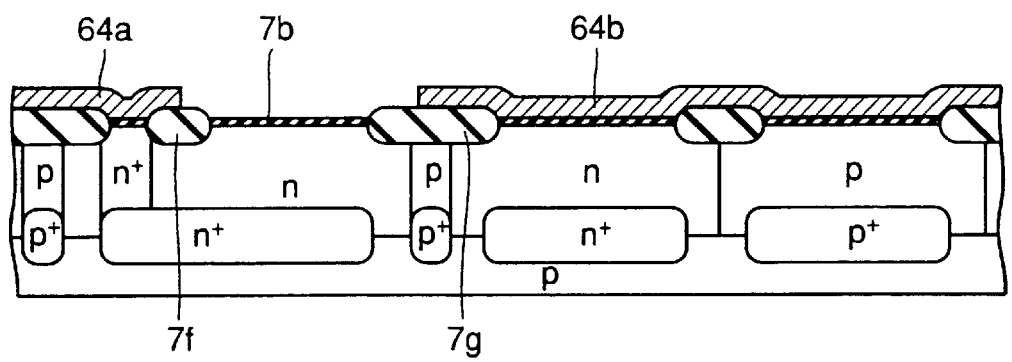
FIG. 23 is a cross section right after etching the polysilicon film to expose an active region of the bipolar transistor, in the manufacturing process of the BiCMOS circuit according to the fourth embodiment of the present invention.
Figure 24:
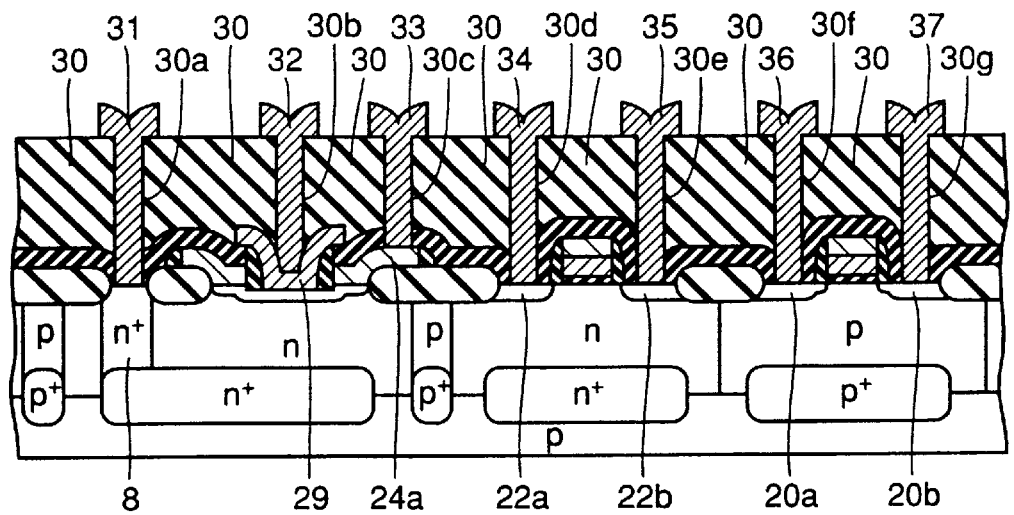
FIG. 24 is a cross section right after connecting aluminum interconnections to the collector wall region, emitter electrode, base electrode, and source/drain regions of the P and N channel MOS transistors, in the manufacturing process of the BiCMOS circuit according to the fourth embodiment of the present invention.

Thereafter, as shown in FIG. 23, polysilicon film 64 is etched to expose oxide film 7b and only parts of respective isolating oxide films 7f and 7g, to form polysilicon films 64a and 64b. After this, as in the first embodiment, the steps described with reference to FIGS. 3 through 15 are taken, and thus the BiCMOS circuit according to the present embodiment with a structure as shown in FIG. 24 is completed.

This type of manufacturing method allows making large the impurity concentration of polysilicon films 13b and 15b to be the lower layers of the respective gate electrodes in advance, and thus, a still larger amount of impurity can be diffused in the gate electrode upper layers. Accordingly, the impurity concentration of the upper surface of polysilicon films 13a and 15a to be the upper layers of gate electrodes 13 and 15, respectively, can be made large. As a result, it becomes possible to reduce gate resistance as well as contact resistance of aluminum interconnections 31, 32, 33, 34, 35, 36 and 37 that are connected to the gate electrodes.

Note that an amorphous silicon film doped with P in advance may be deposited instead of introducing impurity into polysilicon film 64. Furthermore, the manufacturing steps according to the present embodiment can be incorporated into the steps of the second or third embodiment so as to reduce gate resistance as well as contact resistance of interconnections to be connected to the gate electrodes.

Fifth Embodiment

A structure of the BiCMOS circuit according to the fifth embodiment of the present invention and a method of manufacturing the same will be described with reference to FIG. 5. The manufacturing method of the BiCMOS circuit according to the fifth embodiment takes the same steps as in the first embodiment up to the step shown in FIG. 4. Next, the structure as shown in FIG. 5 is annealed in nitrogen ambient at 850° C. for 30 minutes to cause the impurity in the lower layer polysilicon films 13b and 15b to diffuse into the upper layer polysilicon films 13a and 15a, thereby achieving uniform impurity concentration in gate electrode 13 and 15. Thereafter, the manufacturing steps as shown in FIGS. 6 through 14 in the first embodiment are taken, and thus the BiCMOS circuit according to the present embodiment is completed. The structure thereof is shown in FIG. 14.

When the above-described manufacturing steps are taken, the annealing step allows uniform impurity concentration to be achieved in the lower layer polysilicon films 13b and 15b and in the upper layer polysilicon films 13a and 15a of respective gate electrodes 13 and 15. In addition, as the annealing step is performed after patterning of gate electrodes 13, 15, and polysilicon film 53 to be a base electrode is completed, it is possible to prevent an impurity of a conductivity type that is opposite to the original conductivity type of the base electrode from diffusing from the lower layer polysilicon films 51a and 51b to the upper layer polysilicon film 52. Accordingly, increase in electric resistance of base electrodes 23b and 24b can be suppressed.

Furthermore, if amorphous silicon films are used to form polysilicon films 13a, 13b, 15a and 15b constituting the upper and lower layers of respective gate electrodes 13 and 15, annealing before patterning of gate electrodes 13 and 15 will cause the films to grow into polysilicon films with large grain boundary. The shape after etching reflects the grain boundary, and therefore, variation in dimension will become large. According to the manufacturing method of the present embodiment, however, annealing is conducted after the patterning of gate electrodes 13 and 15 is completed, thus hindering deterioration in capability of controlling dimensions of gate electrodes 13 and 15.

Moreover, annealing performed after formation of p type source/drain regions 22a, 22b and n type source/drain regions 20a, 20b may cause the p type source/drain regions 22a, 22b and n type source/drain regions 20a, 20b to expand, depending on the conditions regarding the temperature and time of annealing. According to the manufacturing method of the present embodiment, however, annealing is performed before the formation of p type source/drain regions 22a, 22b and n type source/drain regions 20a, 20b, thereby reducing the possibility in diffusion of the impurity in the p type source/drain regions 22a, 22b and n type source/drain regions 20a, 20b. As a result, deterioration in semiconductor characteristics of the P channel and N channel MOS transistors can be suppressed.

Sixth Embodiment

Figure 25:
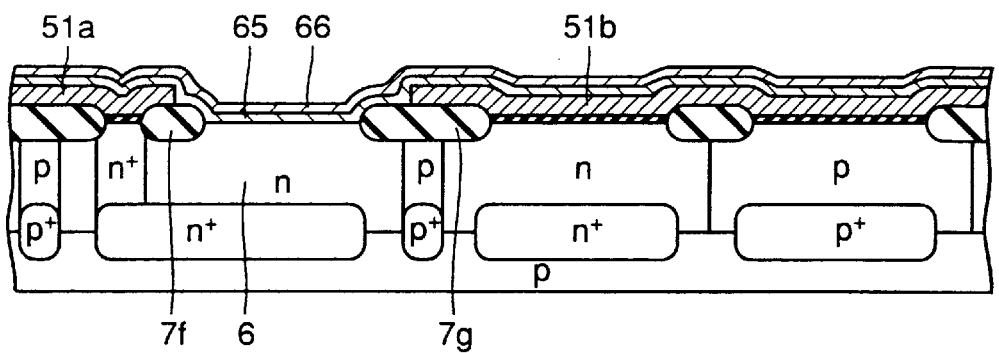
FIG. 25 is a cross section right after the formation of a metal film on the polysilicon film to be a base electrode and on the polysilicon film to be a gate electrode upper layer, in the manufacturing process of the BiCMOS circuit according to a sixth embodiment of the present invention.
Figure 26:
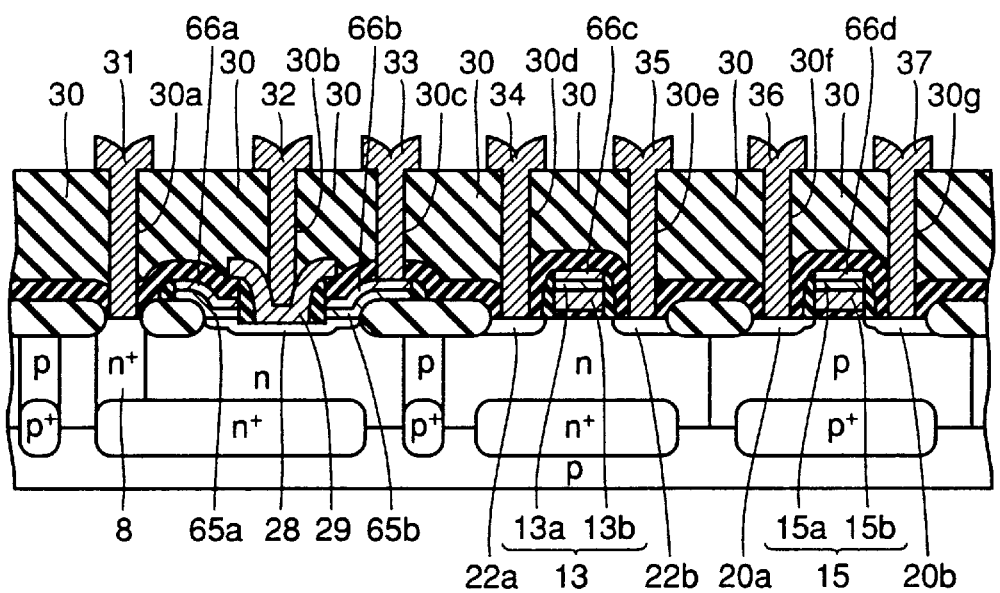
FIG. 26 is a cross section right after connecting aluminum interconnections to the collector wall region, emitter electrode, base electrode, and source/drain regions of the P and N channel MOS transistors, in the manufacturing process of the BiCMOS circuit according to the sixth embodiment of the present invention.

A structure of the BiCMOS circuit according to the sixth embodiment of the present invention and a method of manufacturing the same will be described with reference to FIGS. 25 and 26. The method of manufacturing the BiCMOS transistor according to the present embodiment takes steps similar to those of the first embodiment until the structure shown in FIG. 2 is achieved. Next, as shown in FIG. 25, a polysilicon film 65 that is doped with no impurities is deposited on the entire surface with a film thickness of 1000 Å. Thereafter, a tungsten silicide film 66 with a film thickness of 1000 Å is deposited on the polysilicon film.

Thereafter, substantially the same steps as shown in FIGS. 5 through 14 in the first embodiment are taken to complete the BiCMOS circuit. The final structure is shown in FIG. 26. The BiCMOS circuit according to the present embodiment as shown in FIG. 26 is identical to the BiCMOS circuit according to the first embodiment, except that in the former one, tungsten silicide films 66a, 66b, 66c and 66d have been formed on the polysilicon films to be base electrodes 65a, 65b and polysilicon films 13a, 15a constituting the upper layers of gate electrodes 13, 15, respectively.

According to the above-described manufacturing steps, tungsten silicide films 66a, 66b, 66c and 66d are formed on the polysilicon films to be base electrodes 65a, 65b, and polysilicon films 13a, 15a constituting the upper layers of gate electrodes 13, 15, respectively. Accordingly, even if the polysilicon films 13a, 15a to be the upper layers of gate electrodes 13, 15 of respective CMOS transistors and the polysilicon films to be base electrodes 65a, 65b of the bipolar transistor are made thin, it is possible to make small the gate resistance and base resistance of gate electrodes 13, 15 and base electrodes 65a, 65b, as well as the contact resistance of aluminum interconnections 31, 32, 33, 34, 35, 36 and 37 with respect to the gate and base electrodes.

Seventh Embodiment

Figure 27:
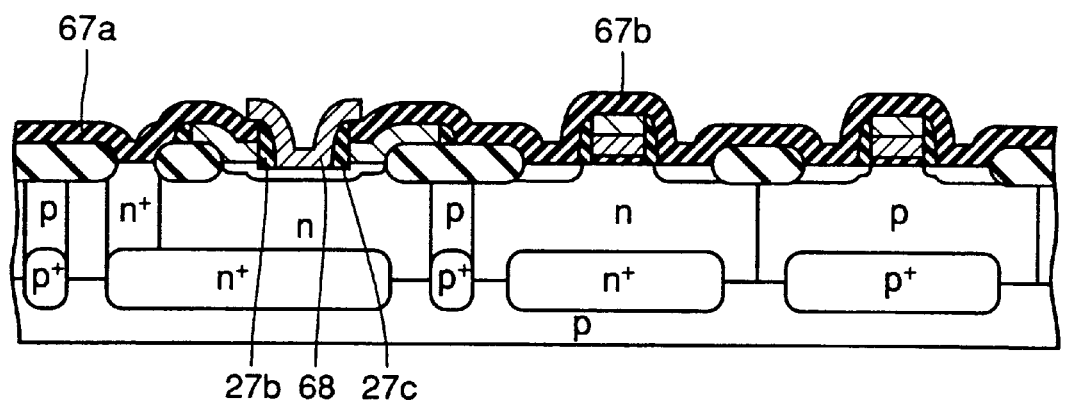
FIG. 27 is a cross section right after the formation of an oxide film on the emitter electrode, in the manufacturing process of the BiCMOS circuit according to a seventh embodiment of the present invention.

A structure of the BiCMOS circuit according to the seventh embodiment of the present invention and a method of manufacturing the same will be described with reference to FIGS. 27 to 30. The method of manufacturing the BiCMOS circuit according to the present embodiment takes the same steps as those in the first embodiment up to the step shown in FIG. 12. Next, a polysilicon film doped with no impurities is deposited on the entire surface of the structure as shown in FIG. 12, with a film thickness of 2000 Å. Thereafter, an n type impurity, e.g., As ions, is introduced at implant energy of 50 KeV with a dosage of $1\times10^{16}$ cm$^{-2}$. Next, a CVD oxide film is deposited on the entire surface. Thereafter, a resist is patterned to form a polysilicon film to be an emitter electrode 68 as shown in FIG. 27.

Figure 28:
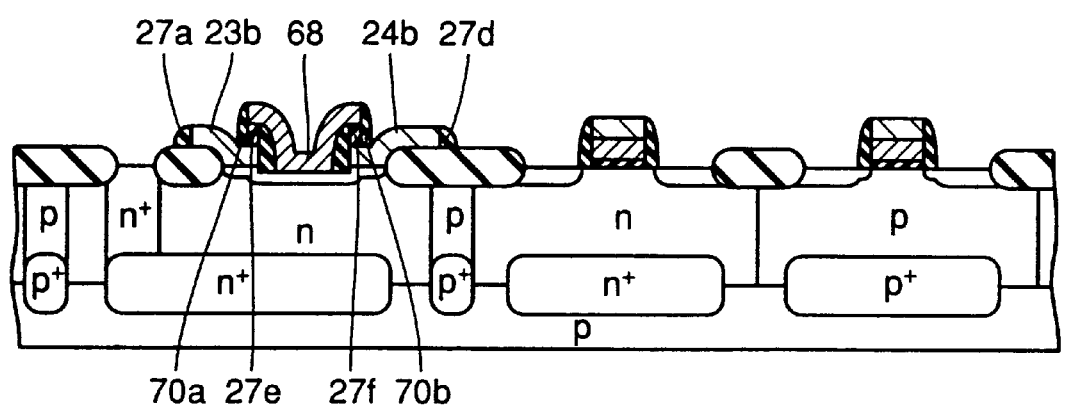
FIG. 28 is a cross section right after the formation of sidewall oxide films on respective sides of the emitter electrode, in the manufacturing process of the BiCMOS circuit according to the seventh embodiment of the present invention.

Next, a CVD oxide film is deposited on the entire surface. The CVD oxide film is then dry etched to expose sidewall oxide films 27a and 27d on respective ends of base electrodes 23b and 24b. Sidewall oxide films 70a and 70b are also formed on respective sides of emitter electrode 68. The structure as shown in FIG. 28 is thus completed. Thereafter, a metal film made of cobalt is deposited by sputtering, with a film thickness of about 100 Å. Next, silicidation of the metal film is performed by ramp annealing. Only the cobalt of which silicidation has not been achieved is then removed from above the oxide film by wet etching.

Figure 29:
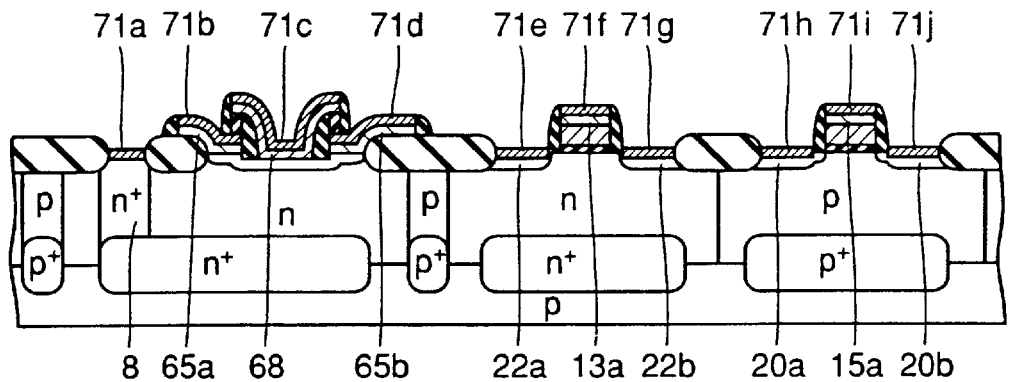
FIG. 29 is a cross section right after forming a metal silicide on the emitter electrode and gate electrode upper layers of the P and N channel MOS transistors, in the manufacturing process of the BiCMOS circuit according to the seventh embodiment of the present invention.
Figure 30:
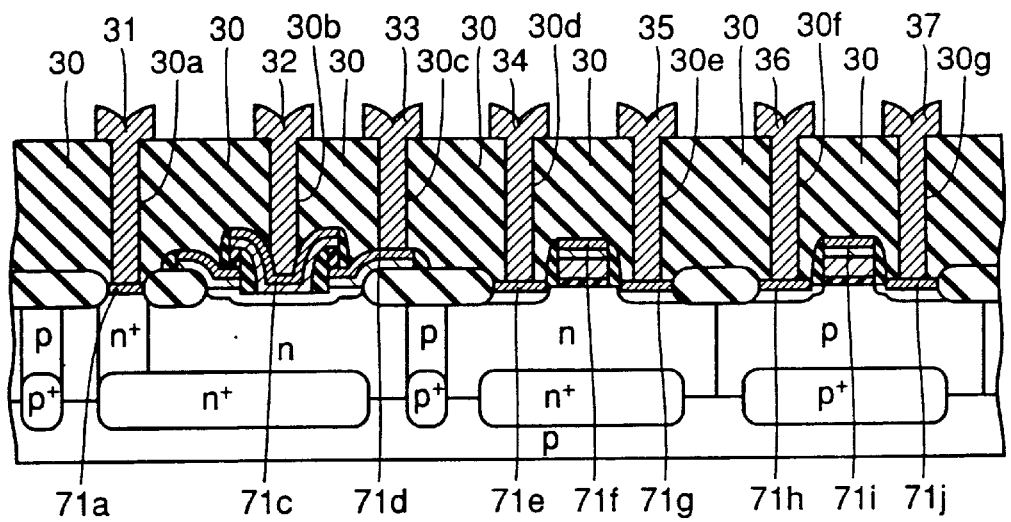
FIG. 30 is a cross section right after connecting aluminum interconnections to the collector wall region, emitter electrode, base electrode, and source/drain regions of the P and N channel MOS transistors, in the manufacturing process of the BiCMOS circuit according to the seventh embodiment of the present invention.

Next, as shown in FIG. 29, ramp annealing is conducted to form metal silicide films 71a, 71b, 71c, 71d, 71e, 71f, 71g, 71h, 71i, and 71j, of a low resistance value. Thereafter, the same step as shown in FIG. 14 in the first embodiment is performed to complete the BiCMOS circuit of the present embodiment with a structure as shown in FIG. 30.

According to the above manufacturing steps, even when polysilicon films 13a and 15a to be upper layers of respective gate electrodes 13 and 15 are made thin so as to prevent reduction in the surface concentration of gate electrodes 13 and 15, metal suicide films 71c and 71d can be formed on the surfaces of base electrodes 65a, 65b of the bipolar transistor and of emitter electrode 68. Accordingly, base resistance, emitter resistance, and contact resistance of base and emitter can be made small.

Further, metal silicide films 71f and 71i, and metal silicide films 71e, 71g, 71h and 71j are formed on the surfaces of polysilicon films 13a and 15a to be upper layers of respective gate electrodes 13 and 15 of the CMOS transistors, and on the surfaces of source/drain regions 22a, 22b, 20a, and 20b. Therefore, gate resistance, sheet resistance, and their contact resistance can be made small. Though cobalt has been used to form the metal film for silicidation in the present embodiment, titanium or nickel may be used, instead.

Eighth Embodiment

Figure 32:
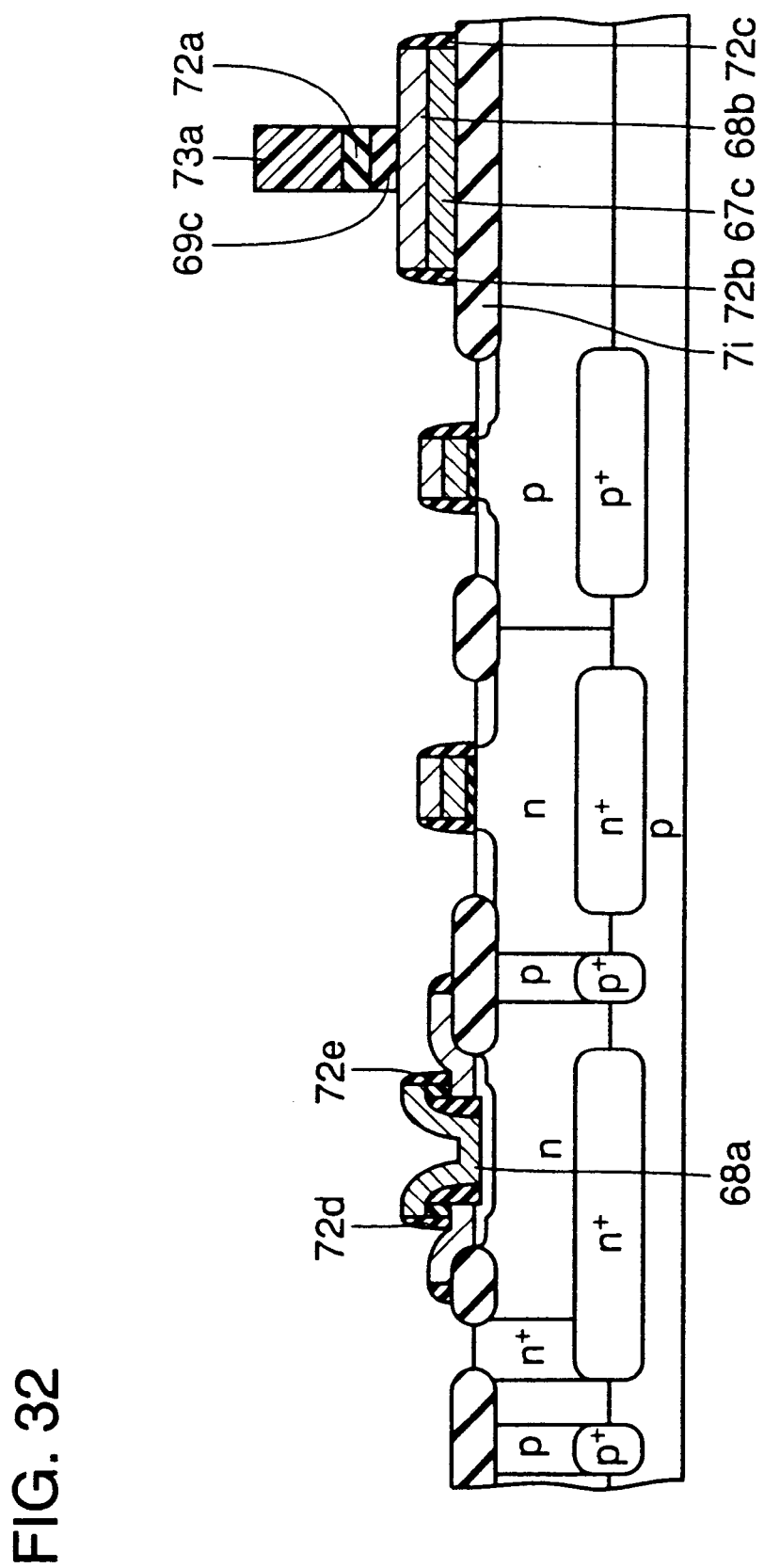
FIG. 32 is a cross section right after forming a mask on the oxide film on the resistance element, in the manufacturing process of the BiCMOS circuit according to the eighth embodiment of the present invention.
Figure 33:
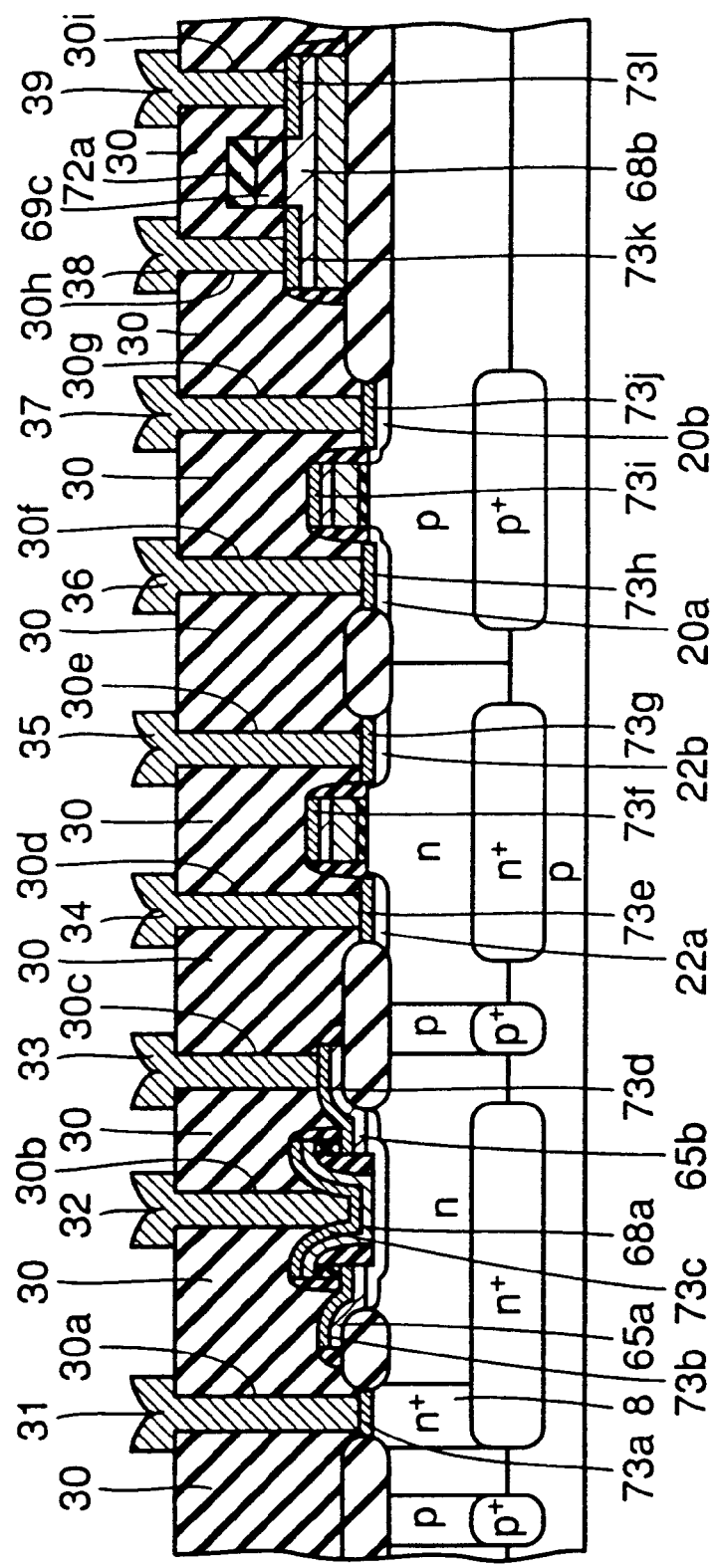
FIG. 33 is a cross section right after connecting aluminum interconnections to the emitter electrode, base electrode, source/drain regions of the P and N channel MOS transistors and the resistance element, in the manufacturing process of the BiCMOS circuit according to the eighth embodiment of the present invention.
Figure 34:
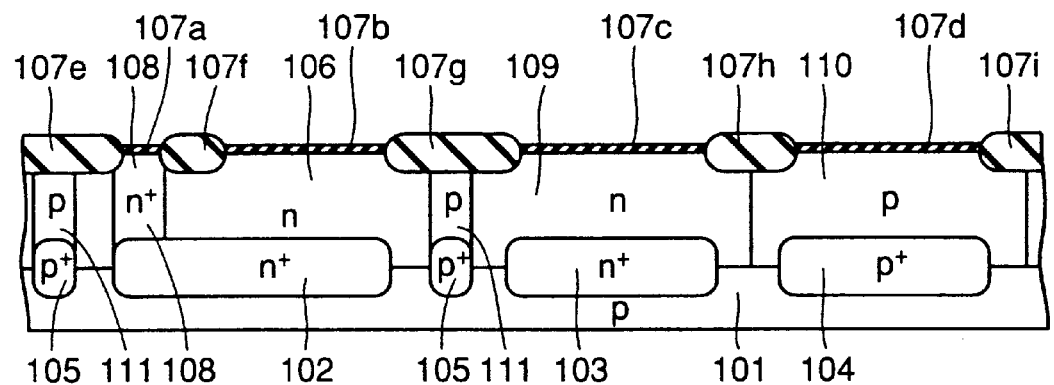
FIG. 34 is a cross section right after forming an isolating oxide film for separating active regions of the bipolar transistor, P channel MOS transistor and N channel MOS transistor, in the manufacturing process of a conventional BiCMOS circuit.
Figure 35:
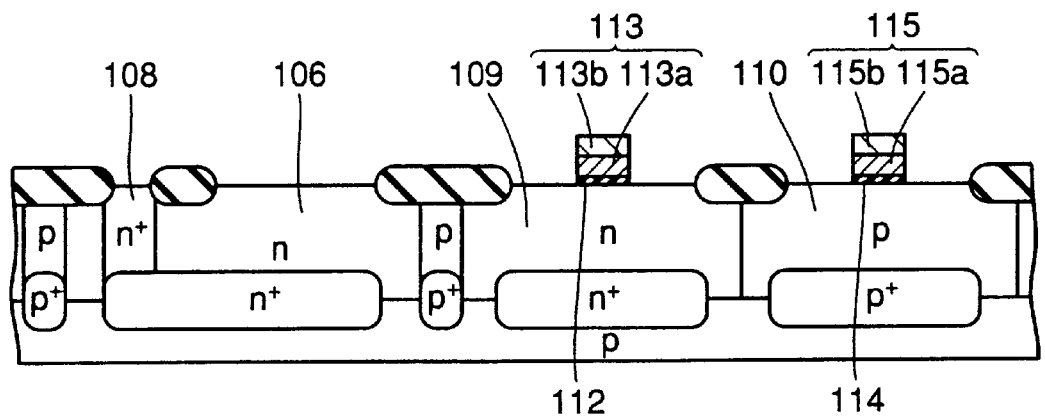
FIG. 35 is a cross section right after forming gate electrodes of the P and N channel MOS transistors, in the manufacturing process of the conventional BiCMOS circuit.
Figure 36:
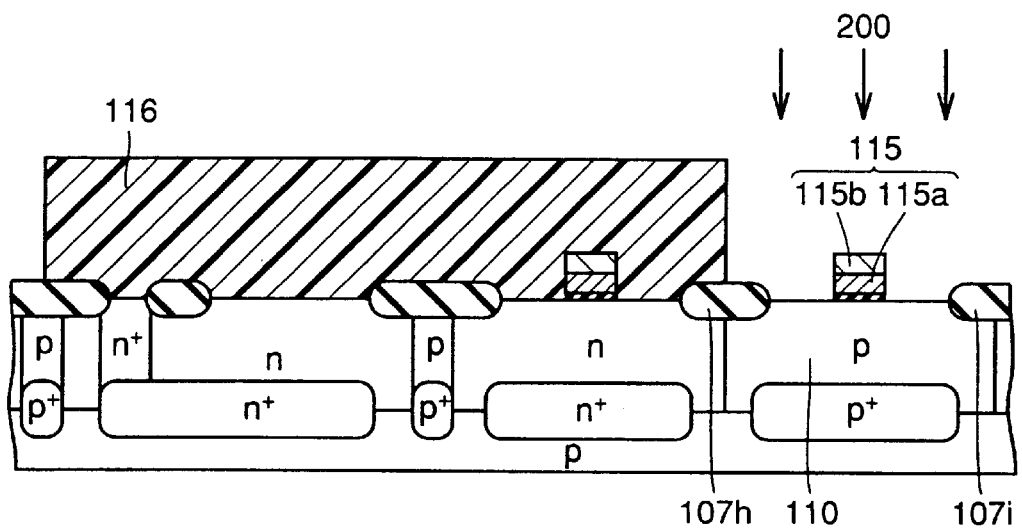
FIG. 36 is a cross section during introduction of impurity into a well of the N channel MOS transistor, in the manufacturing process of the conventional BiCMOS circuit.
Figure 37:
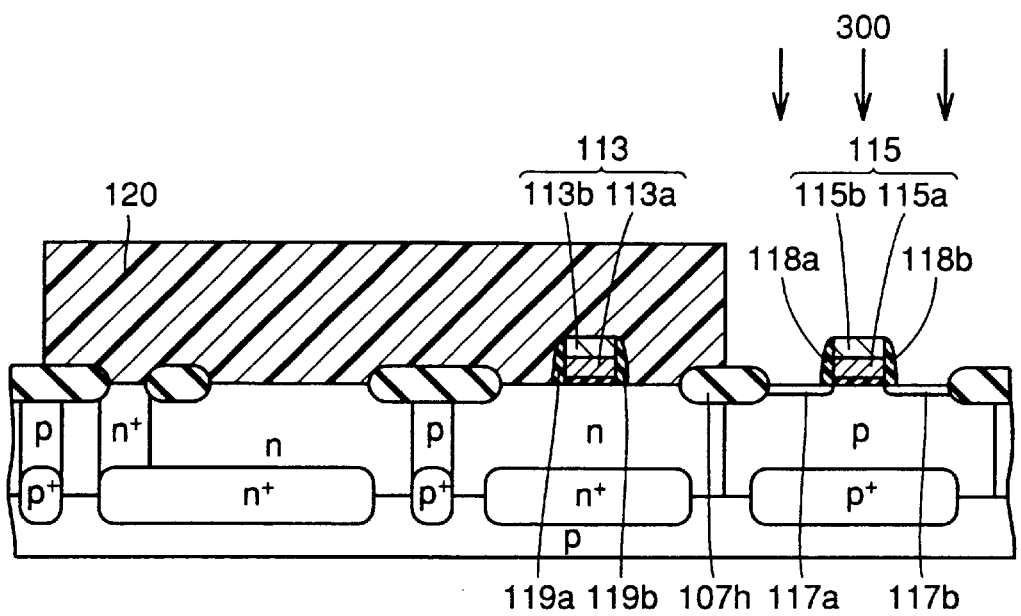
FIG. 37 is a cross section during the second time impurity introduction into the active region of the N channel MOS transistor, in the manufacturing process of the conventional BiCMOS circuit.
Figure 38:
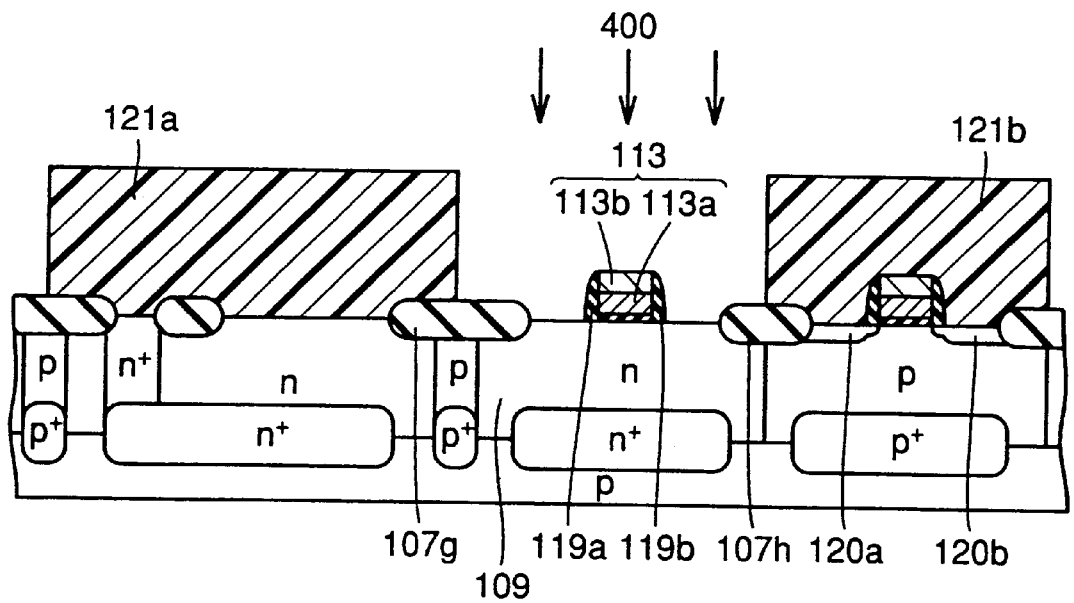
FIG. 38 is a cross section during impurity introduction into the active region of the P channel MOS transistor, in the manufacturing process of the conventional BiCMOS circuit.
Figure 39:
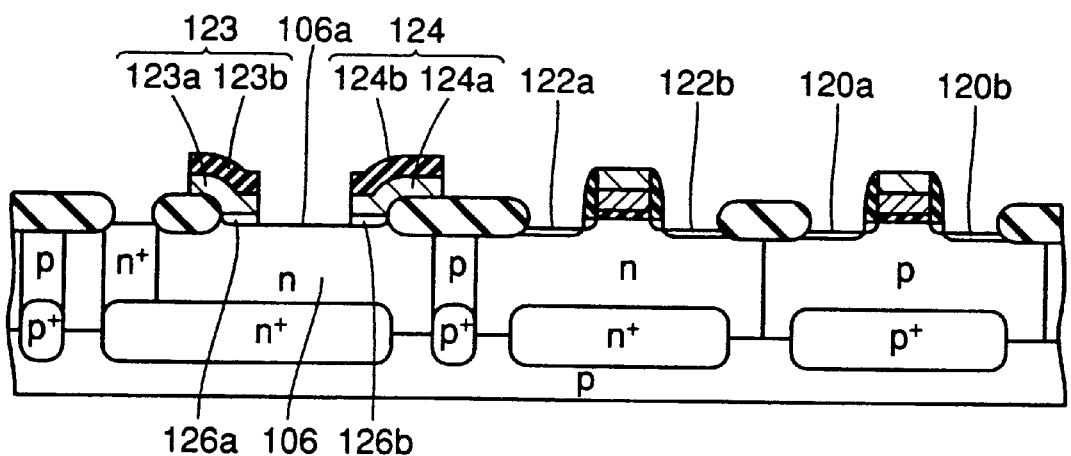
FIG. 39 is a cross section right after opening the polysilicon film to be a base electrode, in the manufacturing process of the conventional BiCMOS circuit.
Figure 40:
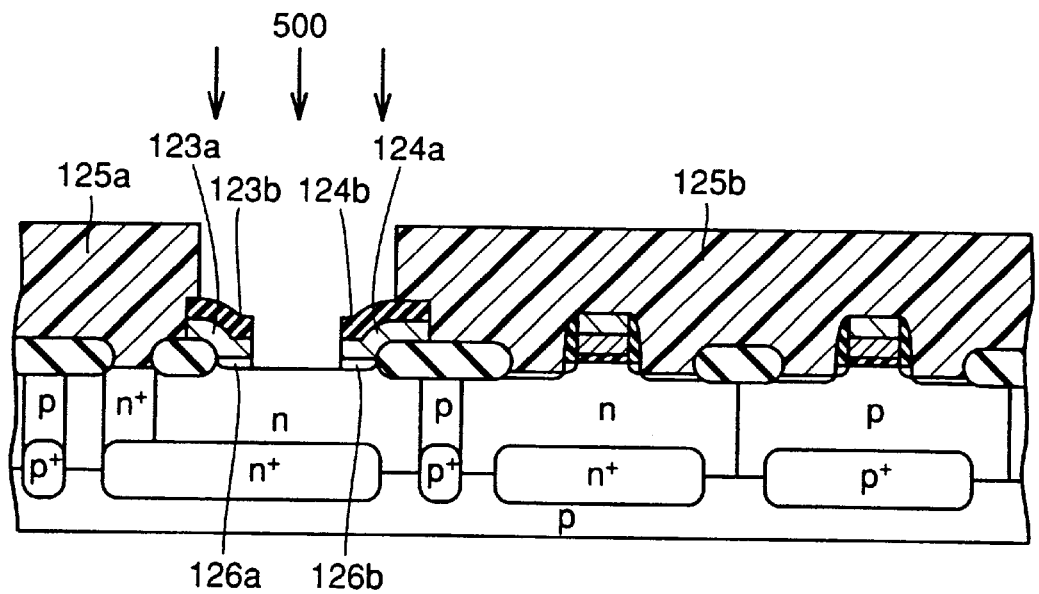
FIG. 40 is a cross section right after introducing impurity from the opening of the polysilicon film to be the base electrode to form an intrinsic base region, in the manufacturing process of the conventional BiCMOS circuit.
Figure 41:
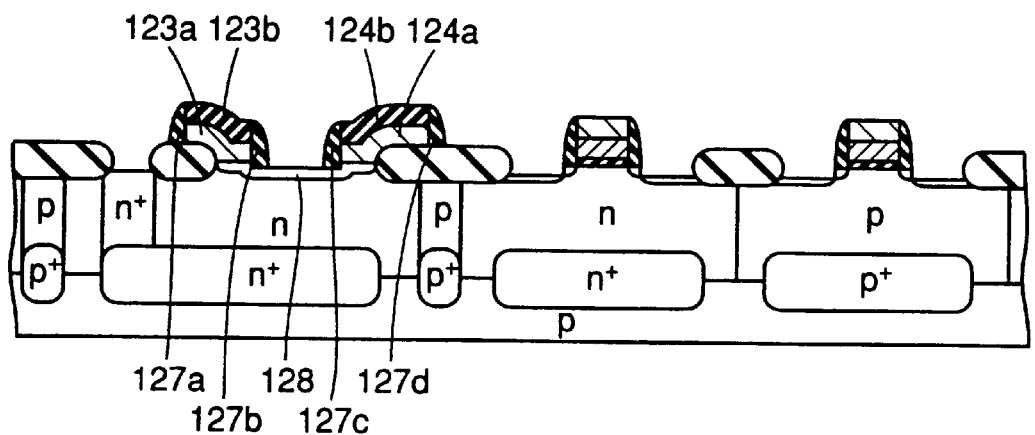
FIG. 41 is a cross section right after forming a sidewall oxide film on an end of the base electrode, in the manufacturing process of the conventional BiCMOS circuit.
Figure 42:
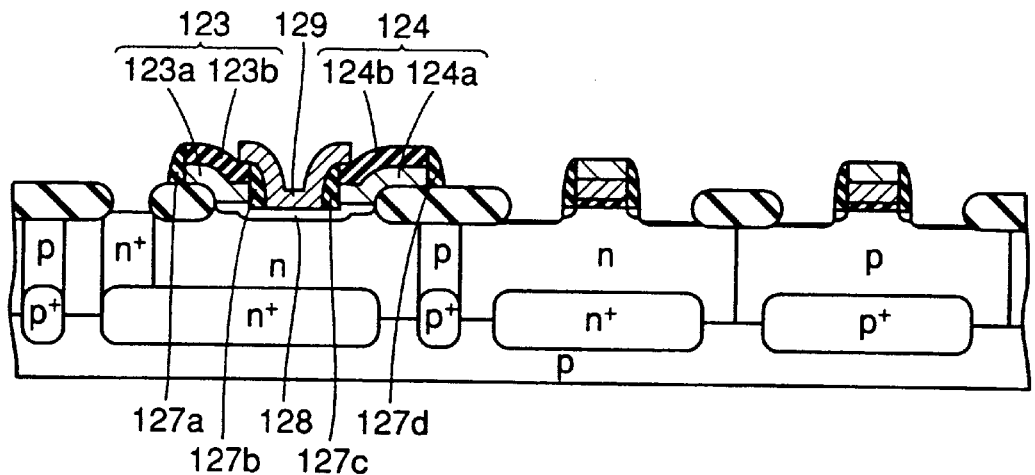
FIG. 42 is a cross section right after forming an emitter electrode connecting to the base electrode, in the manufacturing process of the conventional BiCMOS circuit.
Figure 43:
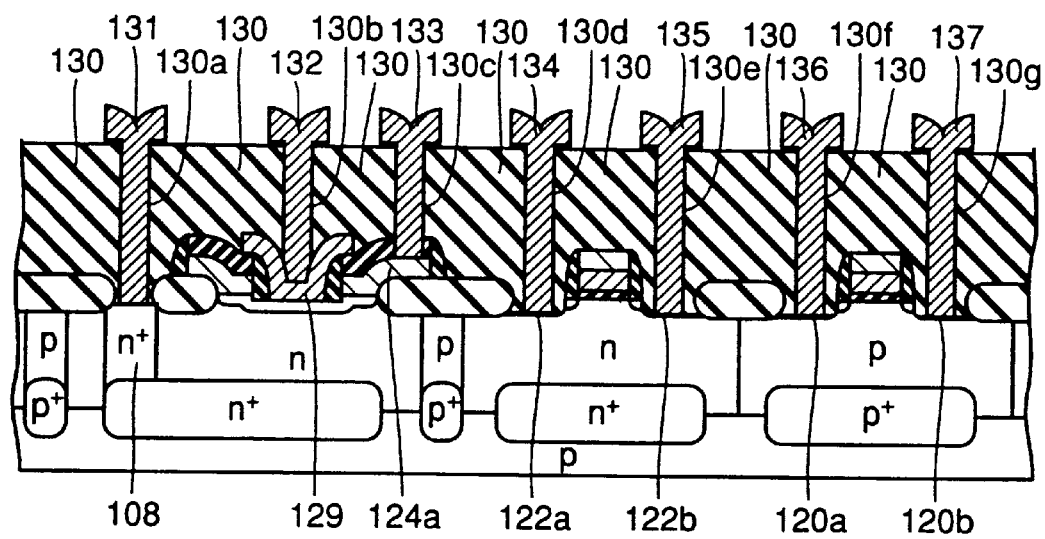
FIG. 43 is a cross section right after connecting aluminum interconnections to the emitter electrode, base electrode, and source/drain regions of the P and N channel MOS transistors, in the manufacturing process of the conventional BiCMOS circuit.

A structure of the BiCMOS circuit according to the eighth embodiment and a method of manufacturing thereof will be described with reference to FIGS. 31 to 33. In the manufacturing method of the BiCMOS circuit according to the present embodiment, the same steps as in the first embodiment are taken up to the step shown in FIG. 12. Thereafter, a polysilicon film is deposited on the entire surface, and a CVD oxide film is further formed on the polysilicon film.

Figure 31:
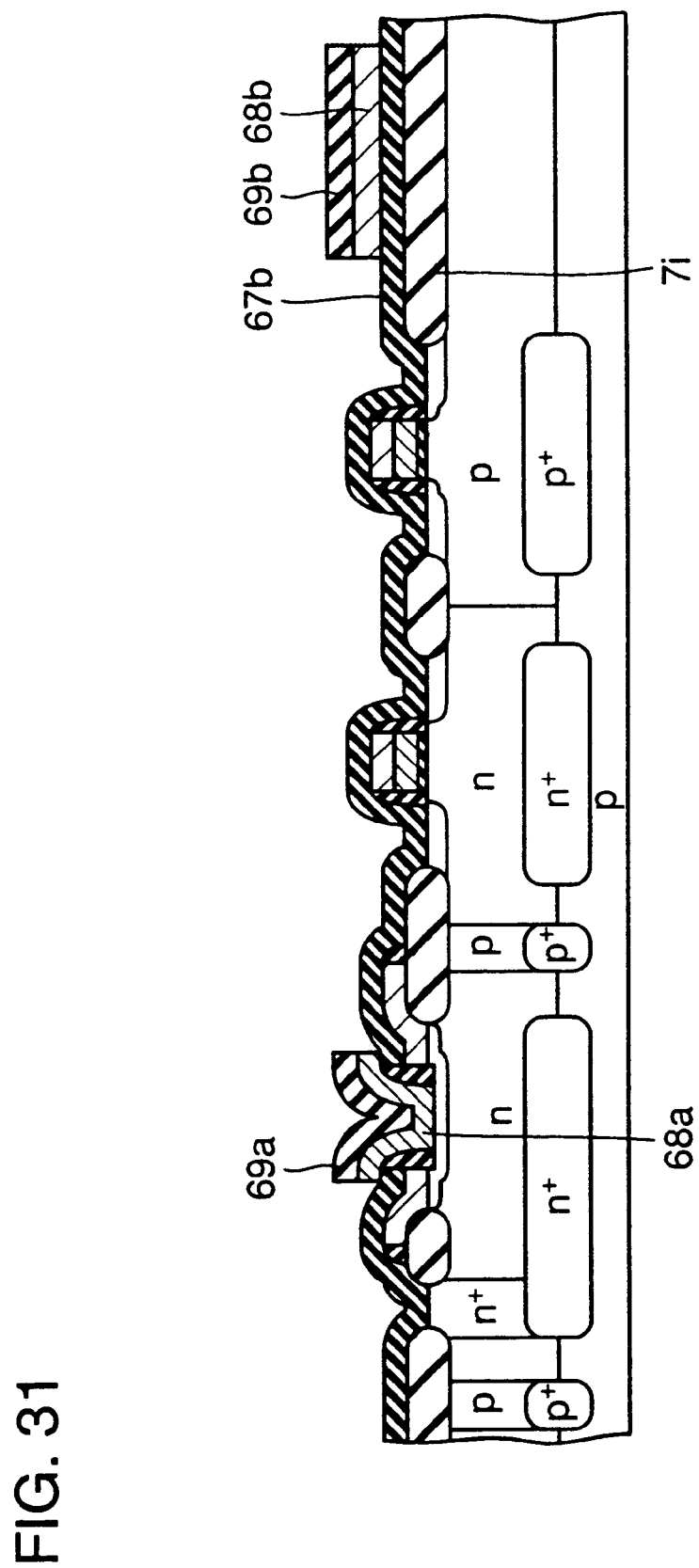
FIG. 31 is a cross section right after the simultaneous formation of an oxide film on the polysilicon film to be a resistance element and of an oxide film on the emitter electrode, in the manufacturing process of the BiCMOS circuit according to an eighth embodiment of the present invention.

Next, as shown in FIG. 31, etching is conducted to form, on one hand, an emitter electrode 68a and an oxide film 69a on top of emitter electrode 68a, and on the other hand, a polysilicon film 68b and an oxide film 69b on top of polysilicon film 68b, above the isolating oxide film 7i with the oxide film 67b interposed therebetween. Thereafter, a CVD oxide film is further deposited on the entire surface. Next, using a mask 73a, the CVD oxide film and oxide film 67b are etched, thereby forming sidewall oxide films 72d and 72e on respective ends of emitter electrode 68a, as well as sidewall oxide films 72b and 72c on respective ends of polysilicon films 68b, as shown in FIG. 32. Thereafter, mask 73a is removed.

Next, silicidation is conducted in the upper portions of collector wall region 8, polysilicon films 65a, 68a, and 65b, p type source/drain regions 22a and 22b, n type source/drain regions 20a and 20b, and gate electrodes 13 and 15. Silicidation is also performed on the surface of polysilicon film 68b that is to be a resistance element, with a prescribed space. Metal silicide films 73a, 73b, 73c, 73d, 73e, 73f, 73g, 73h, 73i, 73j, 73k, and 73l are thus formed. Thereafter, an interlayer oxide film 30 is deposited on the entire surface, and then, contact holes 30a, 30b, 30c, 30d, 30e, 30f, 30g, 30h, and 30i are formed to connect to metal silicide films 73a, 73c, 73d, 73e, 73g, 73h, 73j, 73k, and 73l.

Next, aluminum is filled in contact holes 30a, 30b, 30c, 30d, 30e, 30f, 30g, 30h, and 30i, and also deposited on interlayer oxide film 30. Etching is then conducted to achieve a prescribed pattern, thereby forming aluminum interconnections 31, 32, 33, 34, 35, 36, and 37. The structure as shown in FIG. 33 is thus completed.

According to the above manufacturing steps, polysilicon film 68b for forming a resistance element can be formed at the same time as forming of emitter electrode 68a of the bipolar transistor. This eliminates the necessity in separately forming the polysilicon film 68b for the formation of the resistance element. As a result, two elements can be formed in one step, thus allowing reduction in cost as well as simplification of the process.

In the first through eighth embodiments of the present invention, the n type and p type impurities used for doping or introduction into the semiconductor substrate and polysilicon films have been conditioned as described above. However, the same effects in the manufacturing method of the BICMOS circuit as in the above embodiments can be obtained even when the n type and p type impurities are applied totally opposite to the above condition.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a bipolar transistor and a field effect transistor on a semiconductor substrate, wherein a gate electrode of said field effect transistor is formed of two layers of a gate electrode upper layer and a gate electrode lower layer, and a base electrode of said bipolar transistor and said gate electrode upper layer have a same film thickness.

2. The semiconductor device according to claim 1, wherein said field effect transistor consists of a p channel field effect transistor and an n channel field effect transistor.

3. The semiconductor device according to claim 1, characterized in that said gate electrode upper layer and said base electrode are both formed of a semiconductor layer doped with impurity, and impurity concentrations thereof are different from each other.

4. The semiconductor device according to claim 3, wherein said semiconductor layer includes a polysilicon film.

* * * * *